United States Patent [19]
Tanaka et al.

[11] Patent Number: 5,777,485
[45] Date of Patent: Jul. 7, 1998

[54] PROBE METHOD AND APPARATUS WITH IMPROVED PROBE CONTACT

[75] Inventors: Hideaki Tanaka, Nirasaki; Shinji Akaike, Kofu; Yoshihito Marumo, Yamanashi-ken, all of Japan

[73] Assignee: Tokyo Electron Limited, Tokyo, Japan

[21] Appl. No.: 617,551

[22] Filed: Mar. 19, 1996

[30]    Foreign Application Priority Data

Mar. 20, 1995 [JP] Japan ................................ 7-087475
Aug. 2, 1995 [JP] Japan ................................ 7-216595
Jan. 18, 1996 [JP] Japan ................................ 8-024586

[51] Int. Cl.⁶ ............................................. G01R 1/06
[52] U.S. Cl. ................................. 324/757; 324/765
[58] Field of Search ........................ 324/158.1, 73.1, 324/765, 757, 758, 754; 364/551.01, 550; 438/14, 18; 257/40, 48

[56]              References Cited

U.S. PATENT DOCUMENTS 4,780,836  10/1988  Miyazaki et al. ................ 324/765
5,369,358  11/1994  Metzger et al. .................. 324/754
5,436,571   7/1995  Karasawa ......................... 324/757
5,550,480   8/1996  Nelson et al. .................... 324/754

*Primary Examiner*—Vinh P. Nguyen
*Attorney, Agent, or Firm*—Oblon, Spivak, McClelland, Maier & Neustadt, P.C.

[57]              ABSTRACT

A probe apparatus in which a wafer having IC chips arrayed with electrode pads is supported by a pedestal, and the pedestal is moved relatively to a probe card in the X, Y, Z directions to bring the electrode pads into contact with probes of the probe card so as to perform an electric measurement of the part to be inspected, the apparatus includes a parameter setting part for setting a distance in the Z direction between the probe and the electrode pad when the pedestal is moved along the X, Y planes to specify the initial position of the chip, a memory unit for storing the distance in the Z direction set by the parameter setting part, and a control unit for moving the pedestal in the Z direction in a manner to be apart from the probe card on the basis of the distance in the Z direction stored in the memory unit to move the chip to the initial position, and moving relatively the pedestal in the Z direction from the position to the probe card so as to contact the electrode pad of the chip with the probe.

8 Claims, 19 Drawing Sheets

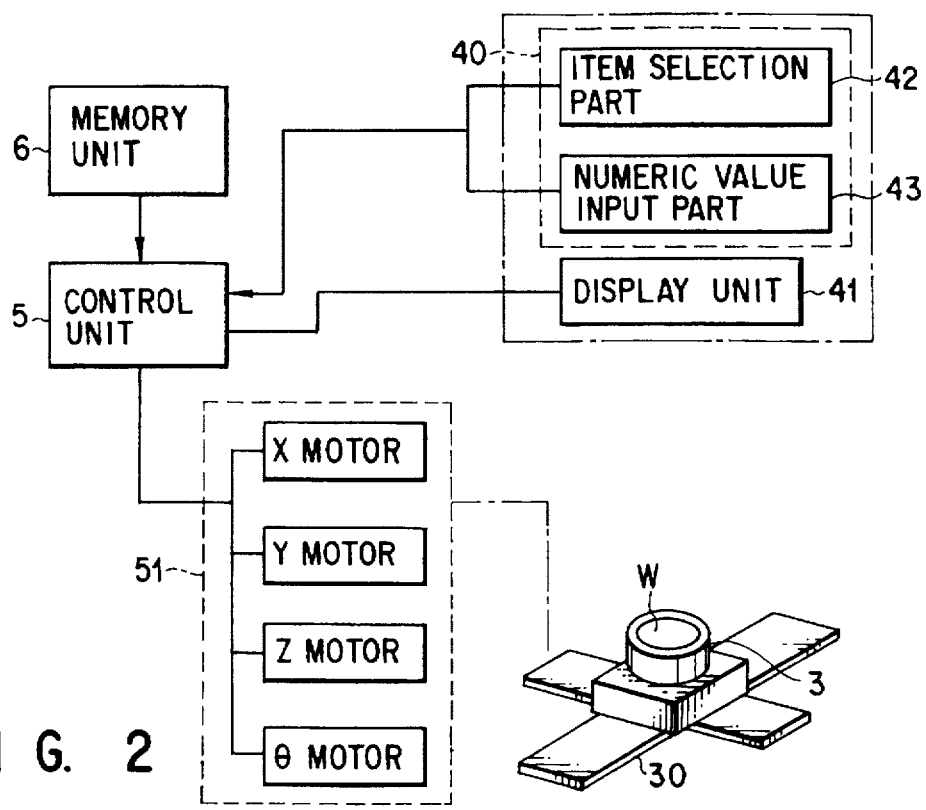
F I G. 2
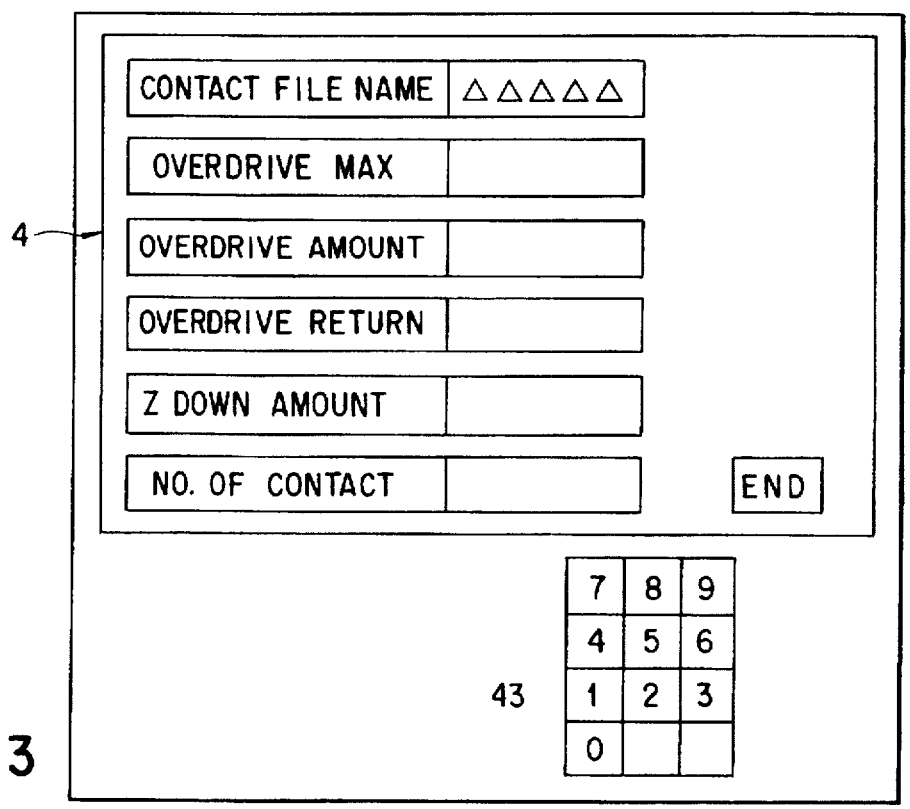
F I G. 3

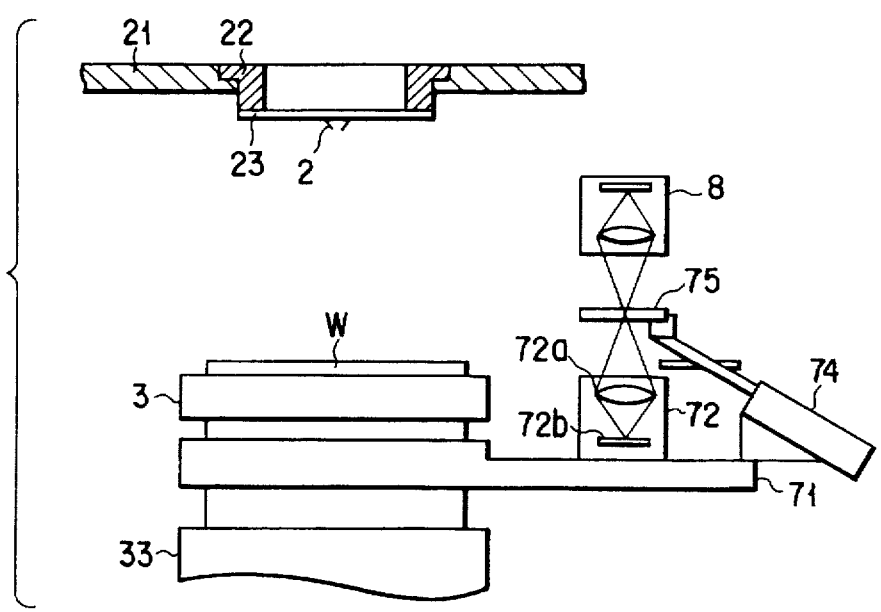
F I G. 4
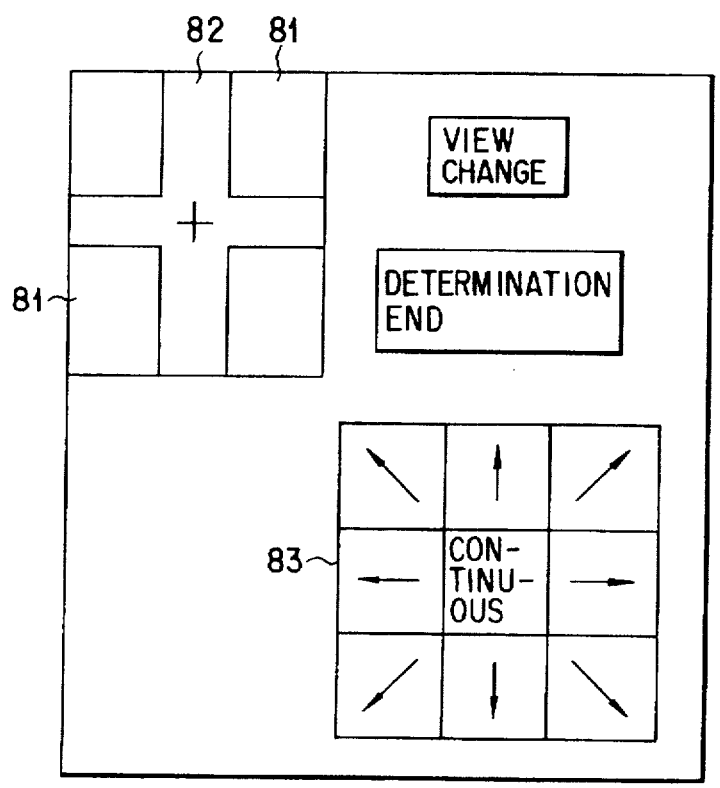
F I G. 5

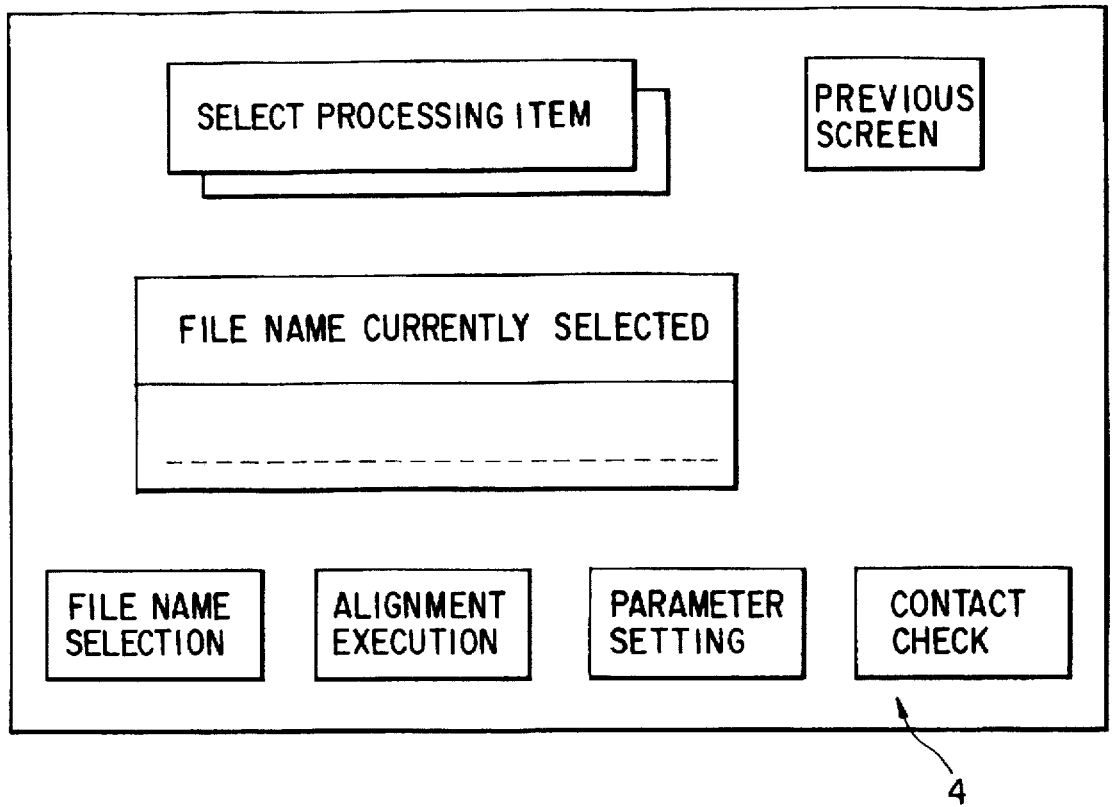
F I G. 6
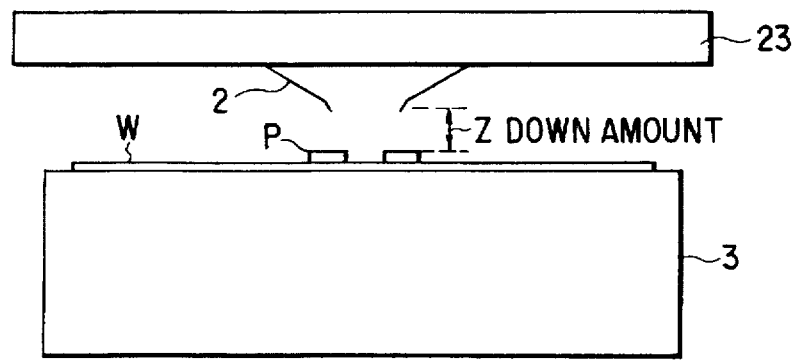
F I G. 7

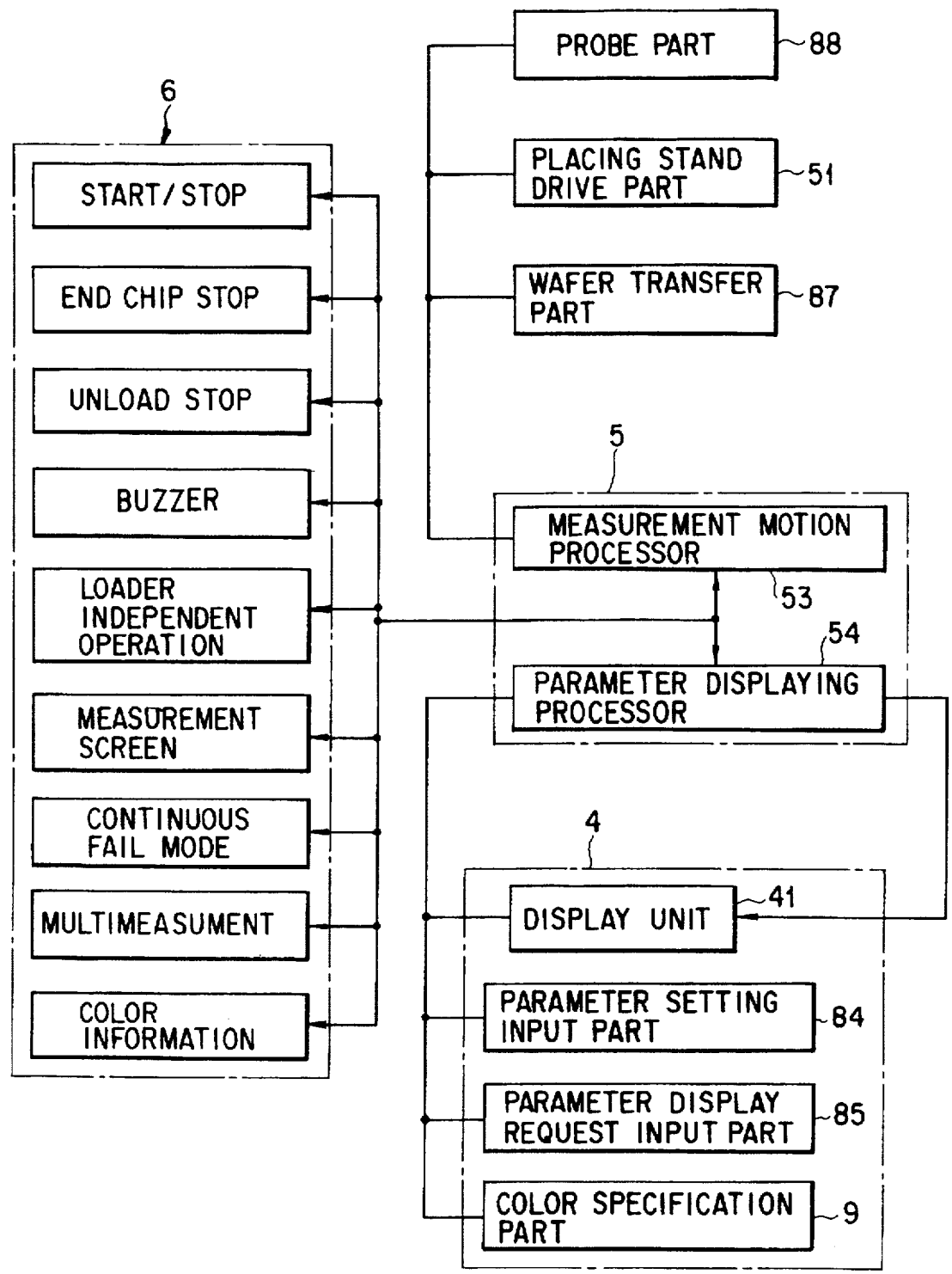
F I G. 10

COLOR SPECIFICATION SCREEN

| GROUP | COLOR |
|---|---|
| PREINSPECTION CHIP | |
| POSTINSPECTION CHIP | |
| NONDEFECTIVE CHIP PASS | |
| DEFECTIVE CHIP FAIL | |
| PREINKING CHIP | |
| POSTINKING CHIP | |
| SKIP CHIP | |
| | |
| | |
| | |

DETERMINATION

| 7 | 8 | 9 |
|---|---|---|
| 4 | 5 | 6 |
| 1 | 2 | 3 |
| 0 | * | * |

F I G. 12

| PARAMETER CONFIRMATION | |
|---|---|
| | page: 4/4 |

\* INKER

| | |
|---|---|
| INKER MODE | : SEPARATED AREA |
| SELECTED INKER 1 | : UNUSED |
| SELECTED INKER 2 | : UNUSED |
| INKPOSITION FOR SAME AREA | : CONTACT |

\* INKER COUNT QUANTITY SURVEY  : 0 EXECUTION

| | |
|---|---|
| NO. OF INKER 1 EXECUTIONS | : 0 EXECUTION |
| LIMIT OF NO. OF EXECUTION | : 0 EXECUTION |
| NO. OF INKER 2 EXECUTIONS | : 0 EXECUTION |
| LIMIT OF NO. OF EXECUTION | : 0 EXECUTION |
| NO. OF INKER 3 EXECUTIONS | : 0 EXECUTION |
| LIMIT OF NO. OF EXECUTION | : 0 EXECUTION |
| NO. OF INKER 4 EXECUTIONS | : 0 EXECUTION |
| LIMIT OF NO. OF EXECUTION | : 0 EXECUTION |

[ ARTICLE TYPE PARAMETER ] [ MOTION PARAMETER ] [ NEXT PAGE ] [ PREVIOUS PAGE ] [ PREVIOUS SCREEN ]

F I G. 15

| PARAMETER LIST | | | |
|---|---|---|---|
| ITEM | DESCRIPTION | ITEM | DESCRIPTION |
| START CHIP STOP | NOT STOPPING | CONTINUOUS FAIL MODE | STOP |
| END CHIP STOP | STOPPING | WAFER PARAMETER | DETAIL |
| UNLOAD STOP | EXTERNAL SETTING | OVERDRIVE | -500μm |
| BUZZER | UNUSED | MULTI-MEASUREMENT | OPTION |
| LODER INDEPENDENT OPERATION | EXECUTION | POSTMARKING | REGIS-TRATION |
| MEASUREMENT SCREEN | RTWM | | |
| | | | |
| | | | |
| | | | PREVIOUS SCREEN |

FIG. 17

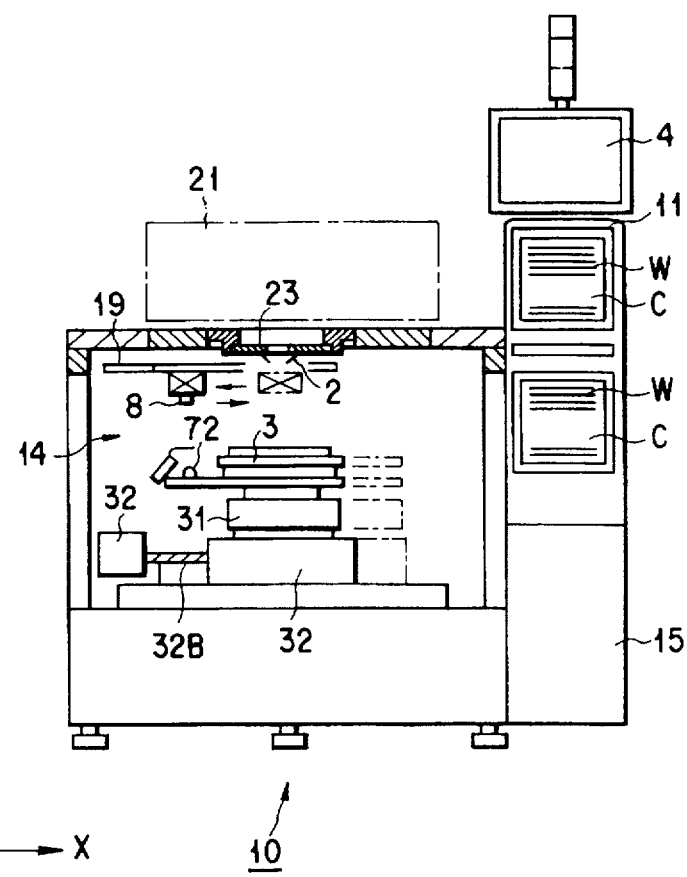
F I G. 18
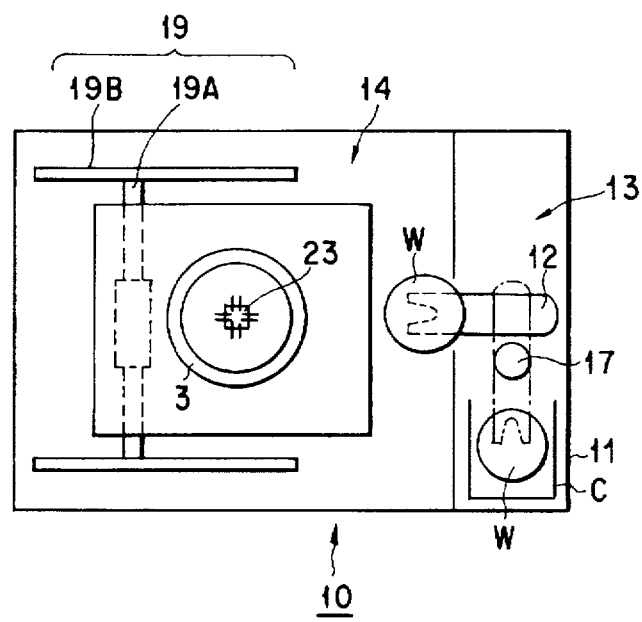
F I G. 19

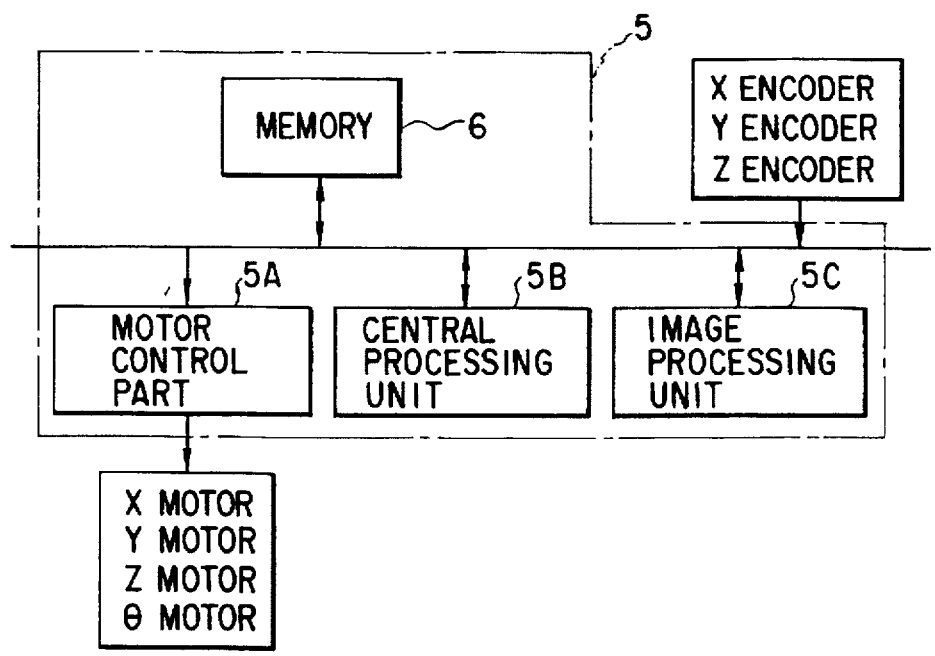
F I G. 21
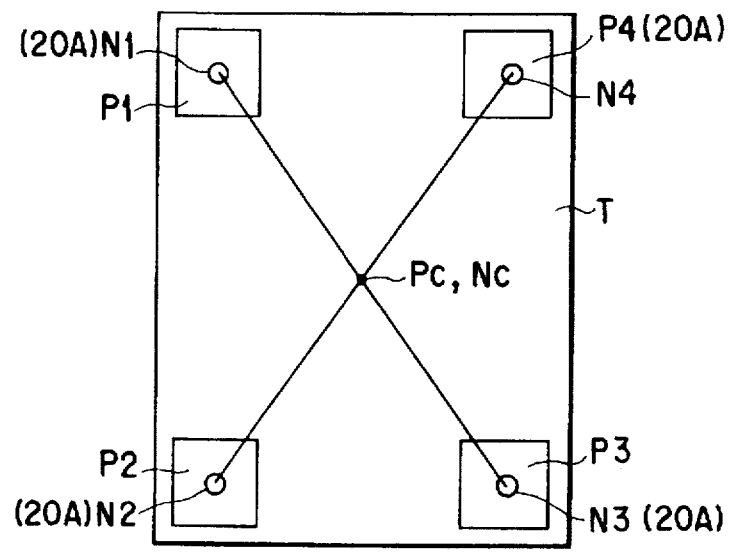
F I G. 22

PROBE METHOD AND APPARATUS WITH IMPROVED PROBE CONTACT

BACKGROUND OF THE INVENTION

1. Field of the Invention

The present invention relates to a probe apparatus in which a subject having a part that is to be inspected and arrayed with electrode pads is provided on a pedestal, and the pedestal is allowed to move relatively to a probe card to bring sequentially the electrode pads into contact with probes of the probe card, thereby performing an electric measurement of the part to be inspected; and to a probing method.

2. Description of the Related Art

In a process of fabricating a semiconductor device, upon completion of IC chips in a wafer following a wafer fabrication process, an electric measurement, called the probe test, is performed by a probe apparatus to check the electrode pattern for short and open, or the IC chips for input/output characteristics, thereby judging whether the IC chips in a wafer state are good or bad. Thereafter, the wafer is cut into IC chips, and good IC chips are packaged and subject to a specified probe test by which a judgment whether final products are good or not is performed.

This inspection is performed by using a probe apparatus. The probe apparatus is provided with a probe card having many probes, which probes are allowed to contact electrically with electrode pads of the respective IC chips in a semiconductor wafer have, and according to a specified program from an IC tester, an inspection signal is supplied from the probes to the above-mentioned chips, whereby whether respective IC chips have specified electrical characteristics or not is tested by the above-mentioned tester.

Briefly explaining an example of a probe apparatus of prior art with reference to FIG. 27, reference number 1 designates a wafer mounting pedestal movable in X, Y, Z, θ directions, and arranged above the mounting pedestal 1 is a probe card 12 provided with probes 11 arrayed correspondingly to the array of electrode pads on an IC chip or IC chips in a wafer. The probes 11 illustrated, also called lateral needles, extend from the under surface of the probe card 12 in a diagonally downward direction. The probe card 12 is fixed to the apparatus body side, and electrodes on the probe card 12 side are connected electrically through a contact ring 13 to a test head 14 provided inclinably on the apparatus body.

In such a probe apparatus, after the mounting pedestal 1 is moved in the X, Y, θ directions to align the wafer W with the probes 11, the mounting pedestal 1 is raised (in the Z direction) from a specified height position to contact the electrode pads with the probes 11, and a specified inspection signal is supplied from the test head 14 through the electrode pads to the chips, whereby whether the chips have specified electrical characteristics or not is tested by the test head 14.

In this case, in one inspection, the probes contact simultaneously with the electrode pad array of one chip or of a plurality of chips to perform inspection simultaneously for each chip or for each plurality of chips, and then the mounting pedestal 1 is lowered and moved by a specified distance in the X direction, Y direction or both directions to align another chip or other chips with the probes, and then the mounting pedestal 1 is raised to contact the electrode pads of the chip or the chips with the probes. Then, where as a result of measurement, the chip or the chips are bad, the chips are separated from the probes 11, and then, for example, an ink from an ink nozzle provided near the probes 11 is dropped on the bad chip, thereby performing making on the bad chip. The height position at which the mounting pedestal 1 starts to rise toward the probe card 12 is fixed with consideration to the protuberance of the making ink in such a manner that, for example, a distance in the Z direction between the top end of the probes 11 and the surface of the electrode pads becomes significantly long, for example, about 500 μm.

In contacting the probes 11 with the electrode pads, even after the electrode pads contact with the probes 11, the mounting pedestal 1 is further raised to allow the probes 11 to be forcedly deflected, whereby the surfaces of the electrode pads are scratched by the needle points of the electrode pads. Such a state in which the electrode pads are pushed upward beyond contact points with the probes 11 is called "an overdrive", and the reason why such overdrive is applied is that a natural oxidation film on the surface of the electrode pad is scraped off by the probe 11 to make secure the electric connection of both.

Such a probe apparatus has an operating part such as a touchpanel. Using the operating part, parameters of determining whether marking is performed on bad chips, at what amount the overdrive is set and the like is set by an operator, and then on the basis of contents determined by the parameters, measurement is performed. On the other hand, when the operator is shifted to another, it is necessary to confirm the contents of the parameters set by the operator before shift. In this case, the confirmation is performed such that, for example, by pressing "Stop" switch displayed on the touchpanel and further pressing "Parameter confirmation" switch to stop temporarily the measurement, the contents of the parameters are displayed on a screen.

In the above-mentioned probe apparatus, the height at which the wafer starts to rise when the electrode pad contacts with the probe 11 is previously fixed, so that the discharging amount of an ink for marking is limited, and it is difficult to change the mode of marking according to the kind of wafer, and depending on the classification of inspection or on the kind of wafer, marking may be not performed. In the latter case, despite the fact that the distance in the Z direction between the electrode pad and the probe 11 needs only to be a little, the protuberance of the ink is considered, so that the motion of the mounting pedestal 1 in the Z direction includes an unnecessary portion, thereby sacrificing a throughput.

Although an overdrive is applied to allow the electrode pad to contact with the probe 11, when the natural oxidation film on the surface of the electrode pad is scraped off by the needle point, a scraped residue slips under the needle point to cause the contact of the probe with the electrode pad to become poor, whereby the reliability of inspection can be deteriorated. Further, although in order to securely scrape off the natural oxidation film on the surface of the electrode pad, it is necessary to apply a somewhat large overdrive, applying of such a large overdrive causes the position of the needle point of the probe to be significantly apart from a predetermined contact point of the electrode pad, so that where the integration density in the circuit of chips becomes high to promote the fine configuration of electrode pads, the needle point can come off the electrode pad.

Also a problem exists that where the contents of parameters are confirmed during measurement, the measurement must be temporarily stopped, so that the operation efficiency is decreased to that extent. In this case, when trying to confirm the contents of parameters upon the completion of the measurement, the confirmation is inconvenient where it takes a long time to measure one wafer. Further, there are many items of parameters in confirming or setting parameters, so that another problem also exists that, for example, one screen is used for each item of respective parameters, and thus scrolling is performed, thereby making confirming operation and setting operation complicated.

SUMMARY OF THE INVENTION

An object of the present invention is to provide a probe apparatus capable of making proper the contact motion of a probe with an electrode pad of a subject to be inspected according to the subject and the classification of inspection, and to provide a probing method.

Another object of the present invention is to provide a probe apparatus which makes secure an electric contact of a probe with an electrode pad, and can perform an inspection with a high reliability, and to provide a probing method.

Still another object of the present invention is to provide a probe apparatus convenient to confirm the contents set by parameters.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a block diagram showing parts of a probe apparatus in connection with the embodiment of the present invention;

FIG. 3 is a view showing an example of the screen of a touchpanel at parameter setting;

FIG. 4 is a sectional view showing a probe card and a mounting pedestal the above-mentioned probe apparatus;

FIG. 5 is a view showing an example of the screen of a touchpanel at position aligning;

FIG. 6 is a view showing an example of the screen of a touchpanel at item selecting;

FIG. 7 is a side view showing a position at which the mounting pedestal starts to move in a Z direction and a probe card;

FIG. 10 is a block diagram showing a configuration relating to the display of parameters;

FIG. 12 is a view showing an example of the operation screen on a color specification part;

FIG. 15 is a view showing an example of the operation screen on the touchpanel;

FIG. 17 is a view showing an example of the operation screen on the touchpanel;

FIG. 18 is a partially sectional view showing a probe apparatus in connection with another embodiment of the present invention, which shows a state in that the front of a prober part is broken;

FIG. 19 is a plan view showing the inside of the probe apparatus shown in FIG. 18;

FIG. 21 is a block diagram showing the control system of the probe apparatus shown in FIG. 18;

FIG. 22 is a plan view showing typically a state in which the tip of a probe needle is aligned with an electrode pad on an IC chip of a semiconductor wafer;

DETAILED DESCRIPTION OF THE PREFERRED EMBODIMENTS

With reference to FIGS. 1 through 17, a probe apparatus in connection with one embodiment of the present invention will be explained hereinafter.

Figure 1:
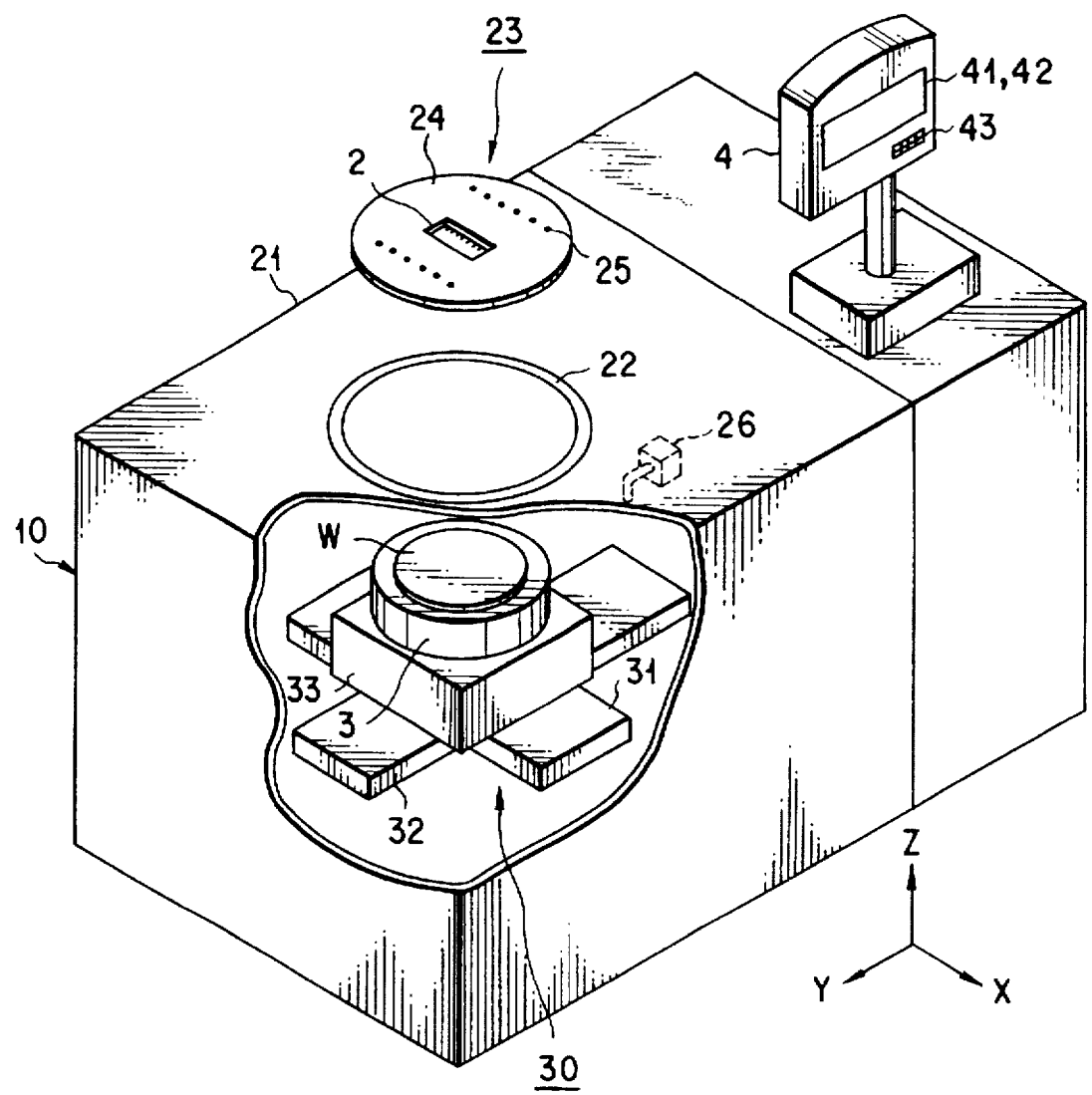
FIG. 1 is a partially broken perspective view showing the appearance of a probe apparatus in connection with one embodiment of the present invention.

FIG. 1 is a view showing schematically the whole of a probe apparatus. In the figure, reference number 21 designates an enclosure forming the exterior part of a probe apparatus 10, in which enclosure 21 an XYZ stage 30 is provided. The XYZ stage 30 comprises an X-directional moving part 31, a Y-directional moving part 32 and a Z-directional moving part 33 which include a ball screw, a guide mechanism, a pulse motor and the like, and placed on the Z-directional moving part 33 is a mounting pedestal 3 for supporting a wafer W. The mounting pedestal 3 is rotatably supported by a well-known means in a θ direction with respect to the moving part 33.

Formed in the upper wall of the above-mentioned enclosure 21 is a circular opening, and fitted onto the periphery of the opening is a ring 22, called an insert ring and the like, for fixing a probe card. As shown in FIG. 4, horizontally mounted on the under surface of the ring 22 is a probe card 23. The probe card 23 is composed such that a plurality of probes 2 are fixed to the under surface of a card body 24 in a manner to extend diagonally downward and that electrodes 25 electrically connected to the respective probes 2 are arrayed on the upper surface of the card body 24; and the plane including the needle points of the entire probes 2 are set in a manner to become parallel to the supporting plane of the mounting pedestal 3. Provided on the side near the probe card 23 in the enclosure 21 is a marking means 26 for performing marking on bad chips with a ink.

Provided on the upper wall of the above-mentioned enclosure 21 is a touchpanel 4 which is operated by an operator and displays the operating conditions and the like of the apparatus. The touchpanel 4, as shown in FIG. 2, includes a display unit 41 comprising a CRT screen and the like, an item selection part or area 42 for selecting an item displayed on the display unit 41 by touching the item on the screen by the operator, and a numerical-value input part or area 43 for inputting a numerical value by specifying a numerical value applicable to the item displayed on the display unit 41 and touch inputting it by the operator. In this example, a condition input part or area 40 for touch inputting a condition into the display is composed of the item selection part 42 and the numerical-value input part 43. The item selection part and/or the numerical-value input part may be composed of a keyboard and a mouse provided separately from the display.

The condition input part 40 is used to input an alignment condition on which the probe card 23 is aligned previously with the wafer W on the mounting pedestal 3, a contact motion condition at which the probes 2 are contacted with electrode pads on IC chips of the wafer W, and a specification on whether marking is performed on bad chips. Now, the input of the contact motion condition at which the probes 2 are contacted with electrode pads by the condition input part 40 will be explained. FIG. 3 shows a screen for setting parameters, in which "Overdrive MAX" is used to specify a maximum value of overdrive amounts capable of being set by the operator, and the maximum value has been previously set on the basis of file names, or can be set by the operator before motion. This is to prevent a setting error in such a manner that the operator cannot set a wrong value larger than Overdrive MAX as an overdrive amount, or if he/she can set, a warning is given. "Overdrive amount" is used to set an amount (a moving distance to raise further the mounting pedestal 3) by which the electrode pads are further raised upward beyond the point at which the probes 2 contact with the electrode pads.

In the probe apparatus of this embodiment, following the alignment in the X, Y, θ directions, the mounting pedestal 3 is set at a certain height position, from which position, the mounting pedestal 3 is raised to contact the electrode pads with the probes 2; following the completion of an electrical measurement through the electrode pad group, the mounting pedestal 3 is lowered to the initial height position, then moved in the X and/or Y direction to allow the next electrode pad group to be opposite to the probes 2 in the Z direction; and thereafter, the mounting pedestal 3 is raised to contact the above-mentions next electrode pads with the probes 2. In the apparatus of this embodiment, there can be set "Z down amount", that is, the above-mentioned height position (a distance in the Z direction between the electrode pad and the needle point of the probe 2) at which the mounting pedestal 3 starts to rise. Further, the probe apparatus is configured such that as with "Z down amount", "Overdrive return" and "No. of contacts" can be set. The numerical values of these parameters are set in μm.

The apparatus is configured such that following a first overdrive state in which a strong or deep overdrive is applied to contact the electrode pads with the probes 2, a kind of weak or shallow overdrive state (a second overdrive state) can be set in which the mounting pedestal 3 is slightly lowered, that is, returned by a pacified amount, "Overdrive return" indicating a distance between the position in the first overdrive state and the position in the second overdrive state. Also, in the apparatus, not only one contact but also a plurality of contacts of the probes are brought into with the same pad (pads), that is, the mounting pedestal is raised/lowered a plurality of times to allow a plurality of measurements on the same pad (pads), "No. of contacts" indicating the number of contacts, that is, the number of measurements.

The above-mentioned touchpanel 4, as shown in FIG. 2, is connected with a control unit 5 including, for example, a central processing unit as a computer main frame and an image control unit, the control unit 5 being connected with a memory unit 6 for storing programs to execute the above-mentioned motions and the parameters set by the condition input part 40. When the mounting pedestal is raised/lowered, an optimum up/down speed pattern is selected on the basis of set values of the Z down amount, that is, for example, the above-mentioned programs include the selection programs or computation programs. The above-mentioned control unit 5 has a function of outputting a control signal for driving and controlling a drive part 51 of the mounting pedestal 3, that is, an-X motor, a Y motor, a Z motor, a θ motor of the XYZ stage 30 on the basis of the programs and parameters stored in the memory unit 6.

Now, an example relating to the mechanism and function for performing the alignment of the wafer W with the probes 2 will be briefly explained (other examples will be later explained in detail). Fixed to the above-mentioned mounting pedestal 3, as shown in FIG. 4, is a first pick-up means 72 through a fixing plate 71, the first pick-up means 72 being configured by combination of a high-magnification optical system 72a and a CCD camera 72b so that the needle point of the above-mentioned probes 2 can be picked up as a magnified image. Also, the first pick-up means 72 includes a low-magnification camera for picking up the array of the probes 2 in a wide range, so that the above-mentioned high-magnification system and the low-magnification system are selectively used. Further, the above-mentioned fixing plate 71 is provided with a target 75 so that it can be moved forward/backward by a forward/backward mechanism in a direction crossing with the optical axis with respect to a focusing plane of the first pick-up means 72.

Provided in a region between the above-mentioned wafer mounting pedestal 3 and the probe card 23 is movably in the X direction a second pick-up means 8 which includes a CCD camera and an optical system unit and which is carried on a moving body (not shown). The above-mentioned target 75 is configured in a manner to be image recognized by the first pick-up means 72 and the second pick-up means 8, for example, in such a manner that a small circular metallic film such as a 140-micron diameter metallic film as a subject for alignment is deposited by evaporation on a transparent glass plate.

Where the alignment is performed for initial setting by the use of above-mentioned pick-up means 72, 8, first the target 75 is used to align the focus and optical axis of the pick-up means 72 with those of the pick-up means 8, and the position of the mounting pedestal 3 at that point is taken as a reference point of the X, Y, Z coordinates on an image; five specified chips consisting of a center chip on the surface of the wafer W and four specified chips located at equal intervals in the peripheral direction are positioned on the lower side of the second pick-up means 8; and the position of the electrode pads of the chips on the wafer W is indexed from the X, Y, Z coordinates for the five specified chips and stored in the memory unit 6. With such an alignment, the focus of the pick-up means 72 is aligned with that of the pick-up means 8, which means that the wafer W and the probes 2 are picked up by a kind of common pick-up means.

FIG. 5 is a view showing a screen in which a specified point on the wafer W, for example, the center of a position at which line paths (gaps) 82 running between chips cross crosswise with each other is taken as a specified point, and the specified point is adjusted in a manner to be positioned at the center (+ mark) of the view of the second pick-up means 8. The operation using this screen is such that while observing a relative position of the specified point to the mark (+), by pressing a switch having a corresponding arrow on a micromovement manual operation part 83 of the mounting pedestal 3 to move stepwise the 1 mounting pedestal 3 (while pressing "Continuous" causes a continuous movement mode), and overlapping the specified point on the mark (+), when, for example, the alignment of a certain specified point is finished, the mounting pedestal 3 is moved in a manner to automatically search the next specified point. In this manner, by the alignment of several specified points, the degree of inclination of the plane including the needle points of all probes to the upper surface of the IC chips is measured and stored in the memory unit 6.

Actual inspection for probes on chips is performed automatically on the basis of the set values stored in the above-mentioned memory unit 6.

The entire operation of the above-mentioned embodiments will be explained hereinafter. First, in the screen of the touchpanel 4 shown in FIG. 6, a file name is selected, and the switch of "Parameter setting" is pressed to display the screen for parameter setting shown in FIG. 3, thereby setting respective conditions (parameters) displayed on the screen as described above. By way of example, the setting of respective conditions is such that the overdrive MAX is set at 200 µm; the overdrive amount, 100 µm; the overdrive return, 40 µm; the Z down amount, 200 µm; and the No. of contacts, 2 contacts, which are performed, for example, by pressing the region of respective items for parameter classification on the same screen and inputting respective numerical values from the numerical-value input part 43 consisting of a numerical value board. In this example, setting is performed without performing marking on bad or fail chips.

Pressing a specified switch causes a subject to be inspected, for example, the wafer W to be placed on the mounting pedestal 3 by an arm (not shown). Then, a switch of the alignment execution on the screen shown in FIG. 6 is pressed to align the wafer W in the X, Y, Z directions with the probes 2 as described above, and thereafter, the electrode pads, as a part to be inspected on the wafer W, are moved to contact with the probes 2.

In this contact motion, as shown in the typical view of FIG. 7, first an electrode pad P (a plurality of electrode pads in detailed description) on the wafer W is allowed to be opposite in the Z direction to the needle point of the probes 2. In this point, the electrode pad P is positioned apart downward by a Z down amount, for example, 200 µm for the above-mentioned setting example from the needle point.

Figure 8:
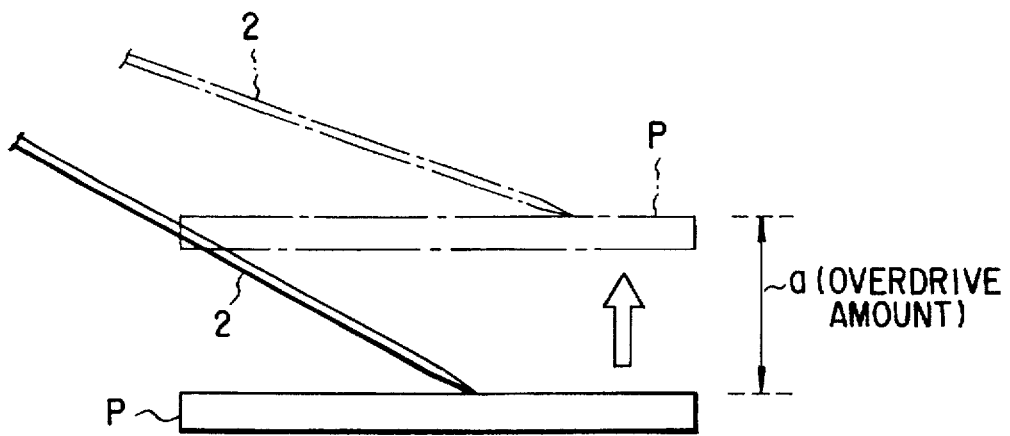
FIG. 8 is a view showing a state in which a probe, in connection with the embodiment of the present invention, contacts with an electrode pad.

Then, the mounting pedestal 3 is raised to contact the electrode pad P with the needle point (at the solid line position) as shown in FIG. 8, and further raised by 100 µm as an overdrive (to the chain line position) to provide the first overdrive state.

Figure 9:
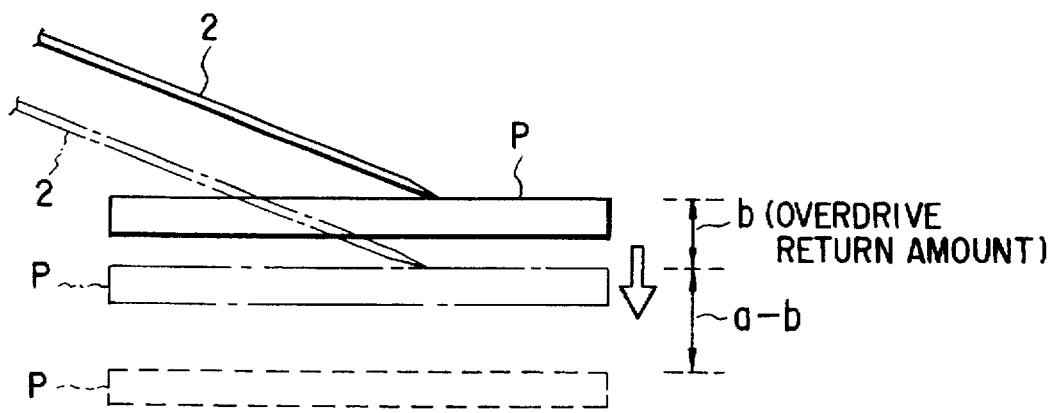
FIG. 9 is a view showing a state in which a probe in connection with the embodiment of the present invention contacts with an electrode pad.

Then, the mounting pedestal 3 is lowered to the initial height position shown in FIG. 7, and then raised again in the same manner to provide the first overdrive state. Thus, since the number of repeated contacts (the number of contacts) is two, the electrode pad P and the probes 2 contact twice with each other, and at the second contact time, as shown in FIG. 9, the mounting pedestal 3 is lowered by an overdrive return 40 µm from the first overdrive state (the solid line position) to provide the second overdrive state (the chain line position). In this motion, actual measurement is performed twice, that is, at the first overdrive when the mounting pedestal 3 is first raised and at the second overdrive when the mounting pedestal 3 is then raised. However, this measurement may be previously set or arbitrarily changed such that the measurement may be performed at the second overdrive position when the mounting pedestal is first raised and at the first overdrive position when the mounting pedestal is then raised, or all measurements may be performed at the first overdrive position or the second overdrive position. The first raising of the mounting pedestal may be used simply to scratch the natural oxidation film on the surface of electrode pads without performing measurement, and the measurement may be performed at the second or later raising of the mounting pedestal. The number of contacts (the number of measurements) is not limited to two, so that one measurement, or three or more measurements may be accepted. When the scraping of natural oxidation film is emphasized, it is preferable that where the number of contacts is one, the measurement is performed at the second overdrive position, while where the number of contacts is plural, it performed at the second contact or later as described above. In FIG. 9, the electrode pad P shown in the dotted line is a contact position with the needle point to which no overdrive is applied.

Thus, in the first or second overdrive state, an inspection signal is supplied from a test head (not shown) through a contact ring (not shown) to the probe card 23, which inspection signal is supplied from the probe 2 to the electrode pad P, and at the same time, a corresponding output signal is supplied from another electrode pad P through the probe 2 to the test head side, thereby causing the electrical characteristics of the IC chips to be measured. Then, upon the completion of the measurement, the mounting pedestal 3 is lowered to the position shown in FIG. 7, and then moved in the X and/or Y direction to allow the electrode pad P to be positioned just under the needle point (at the position where both are opposite in the Z direction), whereby the measurement is performed in the same manner.

According to the above-mentioned probe apparatus, where marking on fail chips is not performed, it is not necessary to consider any protuberance of the ink on the wafer W, so that the Z down amount when the mounting pedestal is moved stepwise can be set at a small value to allow a high throughput to be obtained, while where, for example, marking is performed, the Z down amount can be set according to the marking method, that is, considering the protuberance of the ink, and in view of the marking means, the Z down amount can be arbitrarily set to allow the marking method to be freely set, with the result that a wide degree of liberty is obtained for the system. The setting of the Z down amount may be performed by selecting the amount for each wafer or lot as required.

After the overdrive is applied to the electrode pad P and the probe 2 to contact them with other, the electrode pad P is lowered to be separated once from the probe 2, the overdrive is applied again to both to contact them with other, and in this manner, both are repeatedly contacted by the number of contacts having been set, so that the probe 2 contacts with the trace formed by scraped natural oxidation film on the surface of the electrode pad P, thereby making less a possibility that a scraped residue slips under the needle point.

After the overdrive is applied to the electrode pad P and the probe 2 to contact them with other, the electrode pad P is slightly lowered to make the overdrive amount less, and in this manner, after the needle point scrapes the surface of the electrode pad P, the scraped trace is returned back, whereby a possibility that a scraped residue slips under the needle point can be avoided, which together with the repeated contact motion, makes secure an electrical connection of the probe 2 with the electrode pad P. Further, a strong overdrive is once applied to scrape the natural oxidation film, so that the contact state during measurement needs a weak or shallow overdrive to such an extent that electrical contact is established. Therefore, a lateral dislocation of the needle point on the electrode pad needs a small amount, so that even when the electrode pad is small, the needle point can not come off a specified region of the surface of the electrode pad, thereby allowing a highly reliable inspection to be performed.

As described above, the number of repeated contacts between the electrode pad P and the probe 2, the overdrive amount and the overdrive return amount can be freely set by the operating panel 4, so that a flexible setting can be performed according to the classification of inspection, the kind of wafer, or results of analysis of inspection reliability.

In the method of setting arbitrarily the Z down amount, the probing element may need not only the probe but also a bump and the like. Also, the subject to be inspected may need not only the wafer but also an LCD board.

Now, the function of displaying parameters in the above-mentioned probe apparatus will be explained in detail. FIG. 10 is a block diagram of the part relating to the function of displaying parameters, and in this example, a parameter setting input part 84, a parameter display request input part 85, a color specification part 9 and a display unit 41 are included in the touchpanel 4. The parameter setting input part 84 is a screen, or in detail description, a switch in a screen by which, for example, the overdrive amount or the return amount is set as already shown in FIG. 3, and whether marking on bad chips is performed or not is set, and which includes the item selection part 42 and the numerical-value input part 43 shown in FIG. 2. The parameter display request input part 85 is a screen, or in detail description, a switch in a screen by which the display of parameters is requested during the electrical measurement of chips; and the display unit 41 is a screen of the touchpanel 4. The color specification part 9 is a screen which is used to perform color coding of the array image of chips displayed on the measurement screen as described later.

The control unit 5 used in the probe apparatus includes a measurement motion processor 53 and a parameter displaying processor 54. The measurement motion processor 53 is used to control a mounting pedestal (placing stand) drive part 51, a wafer loading part 87 (a mechanism for loading a wafer between the mounting pedestal and a wafer cassette) and a probe part 88 (a circuit in the test head); and the parameter displaying processor 54 includes a function of storing the contents of parameters set by the above-mentioned parameter setting input part 84, a function of displaying the items and setting contents of parameters stored in the above-mentioned memory unit 6 on the screen of the touchpanel 4, during chip measurement, on the basis of the request for the parameter display in the above-mentioned parameter display request input part 85, and the like function. In FIG. 10, an example of parameter items (such as start stop) is described in the memory unit 6.

Figure 11:
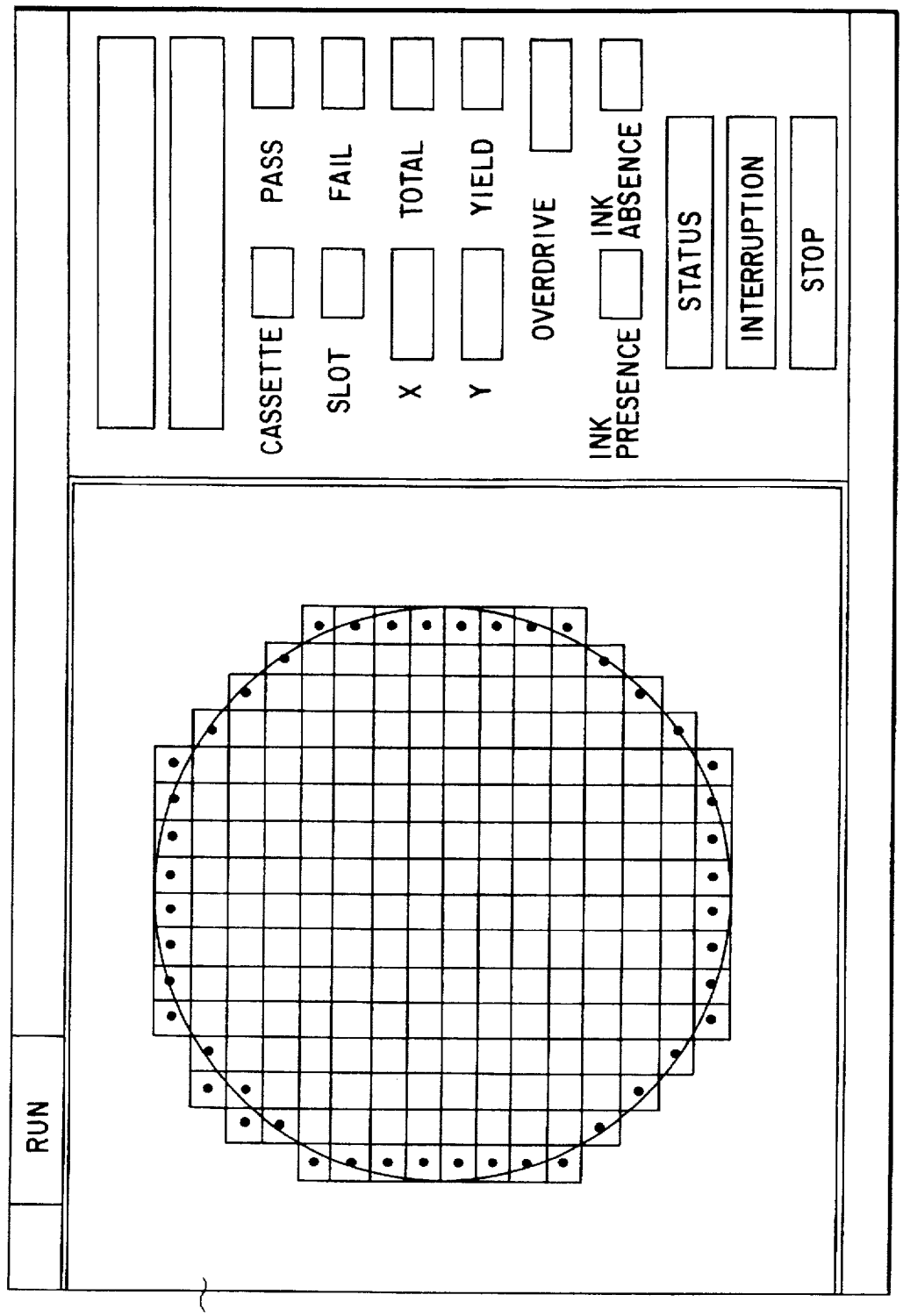
FIG. 11 is a view showing an example of the operation screen on a touchpanel.

Then, there will be explained an example of a screen on the touchpanel for displaying parameters during chip measurement. FIG. 11 is the screen on the touchpanel during chip measurement, in which the image of the chip array of a wafer on the mounting pedestal 3 is displayed on the left side, and positioned adjacently to the display of the wafer is a switch part forming the parameter display request input part 85, that is, in this example, a switch part in which "Interrupt" and "Stop" are displayed.

Displayed in this screen is a chip image after the wafer is searched to recognize the alignment of the probes with the chips as described above, that is, both the X and Y coordinates by the control unit and finish the wafer mapping (understanding respective chip position). In this embodiment, the chips are grouped, and color codes are applied for each group to allow them to be displayed on the measurement screen. That is, the above-mentioned color specification part 9 shown in FIG. 10 is configured as a color specification screen of the touchpanel 4 as shown in FIG. 12, which screen is displayed by selecting a color code menu on a menu screen (not shown). The color code screen is provided with a table 91 for providing a corresponding relation between the color and the groups of chips, a color array part 92 in which, for example, 80 colors are displayed and identified by the numbers assigned longitudinally and laterally, and a numeric key 93 for selecting a required color from those of the color array part 92.

The chip grouping for color coding means that chips are grouped into a preinspection chip, a postinspection chip, a pass chip (a chip judged to be nondefective), a fail chip (a chip judged to be defective), a chip before inking (marking to be performed on defective chips by inker), a postinking chip, a skip chip and the like. Touching, for example, the region for preinspection chips of the table 91 in the color specification screen, and then inputting through the numeric key 93 the number corresponding to a color to be selected from those of the color array part 92 causes the number of the color to be displayed on the left side column of "Preinspection chip" of the table 91. In this manner, the color specification is performed for each group. Such color specification may not be performed, or it may be performed only for a part of groups, for example, "Preinspection chip" and "Postinspection chip." Further, the colors may be finely divided according to the grade of nondefective and defective chips, or color coding may be performed to discriminate between, for example, a best nondefective chip, a nondefective chip, a defective chip and a repairable defective chip.

Figure 13:
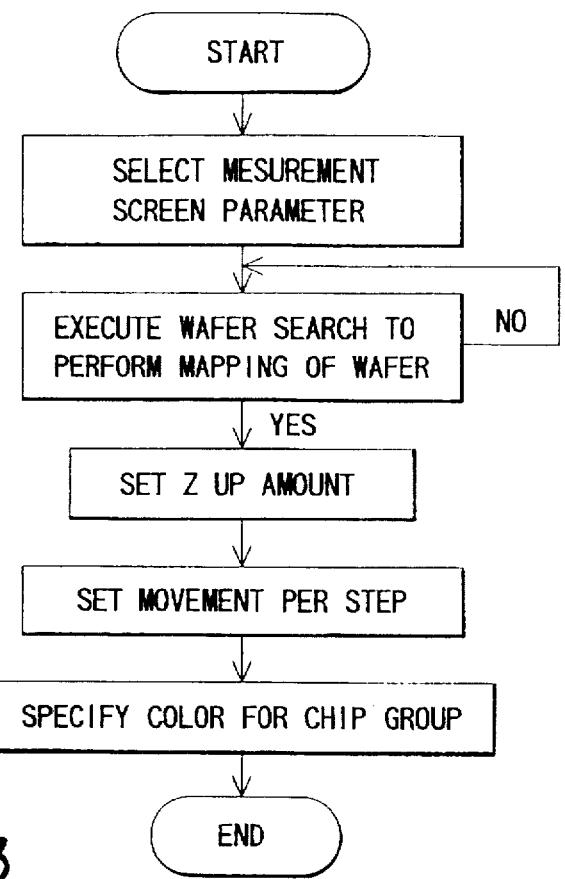
FIG. 13 is a flowchart showing an example of the operation including the color specifying operation on chips.

FIG. 13 is an example of a flowchart including a color specification, in which a wafer mapping is performed, the Z up amount of the mounting pedestal 3 and the movement per step are set, and then a color is specified. Where a color is specified, the color information for each chip is stored in the memory unit 6, and when the chip image of the measurement screen is displayed as shown in FIG. 11, the chips are colored for each group by the control unit 5 on the basis of the color information in the memory unit 6 and displayed. By way of example, the preinspection chip is displayed with green color, and when inspection is performed, a chip judged to be passed is displayed with blue color, while a chip judged to be failed is displayed with red color, in real time.

Therefore, according to such embodiment, at which position the inspection is performed, which chip is nondefective, and which chip is defective can be checked at a glance in real time by a change in the color on the wafer map (the chip image array group) of the measurement screen, thereby providing a significant convenience. Where color coding is performed on nondefective chips before and after inking, or it is also performed on chips to be skipped, it is convenient for an operator to understand inspection circumstances. Even where a color specification is performed, a real-time measurement screen of a wafer map relating to the color specification and a standard screen on which the contents of current parameters and the like are displayed can be changed over during measurement.

Figure 14:
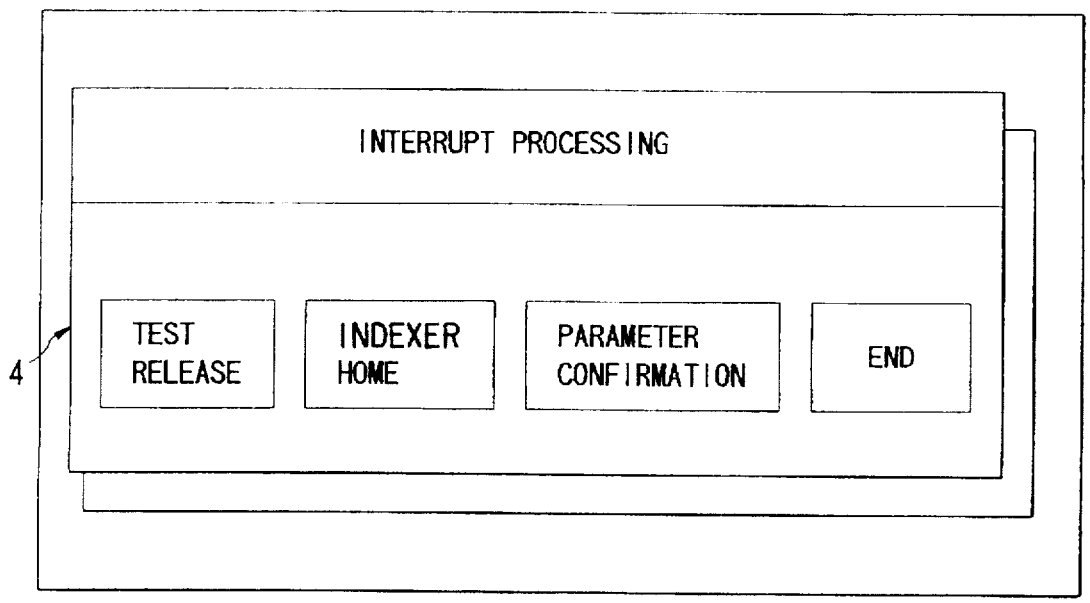
FIG. 14 is a view showing an example of the operation screen on the touchpanel.

In the measurement screen shown in FIG. 11, pressing "Interrupt" switch causes a screen of FIG. 14 to be displayed on a display unit, and further, pressing "Parameter confirmation" switch causes a screen shown in FIG. 15 to be displayed. FIG. 15 is a screen for indicating the detail of items on the marking (the ink marking by an ink marking unit) of defective chips as one of items of parameters, in which inkers 1, 2 through n are the numbers of a plurality of inkers (ink marking units) provided in the probe apparatus.

A screen for confirming parameters, for example, a screen for each parameter item is used, and the items of another parameter, for example, the items relating to the overdrive shown in FIG. 3 together with the contents are displayed by operating of the switches "Next page" or "Previous page." However, article type parameters relating to wafers, for example, items of wafer maps and chips to be not inspected, and motion parameters, for example, items of the overdrive are divided in screen groups from each other such that, for example, pressing "Article type parameter" switch causes a beginning screen relating to article type parameters to be displayed. In this manner, the items and setting contents of parameters are displayed on the screen, during which the above-mentioned measurement motion processor 53 is operated, so that the measurement, as it is, is performed without being interrupted.

According to such embodiment, where the operator is shifted to another, even when the setting contents of parameters set by the operator before shift are being measured, the contents can be confirmed without stopping the measurement, thereby allowing the operation rate of the apparatus to be improved. In a semiconductor fabrication factory, where a plurality of plasma apparatus are operated, even a few operators can confirm the parameters as required.

Figure 16:
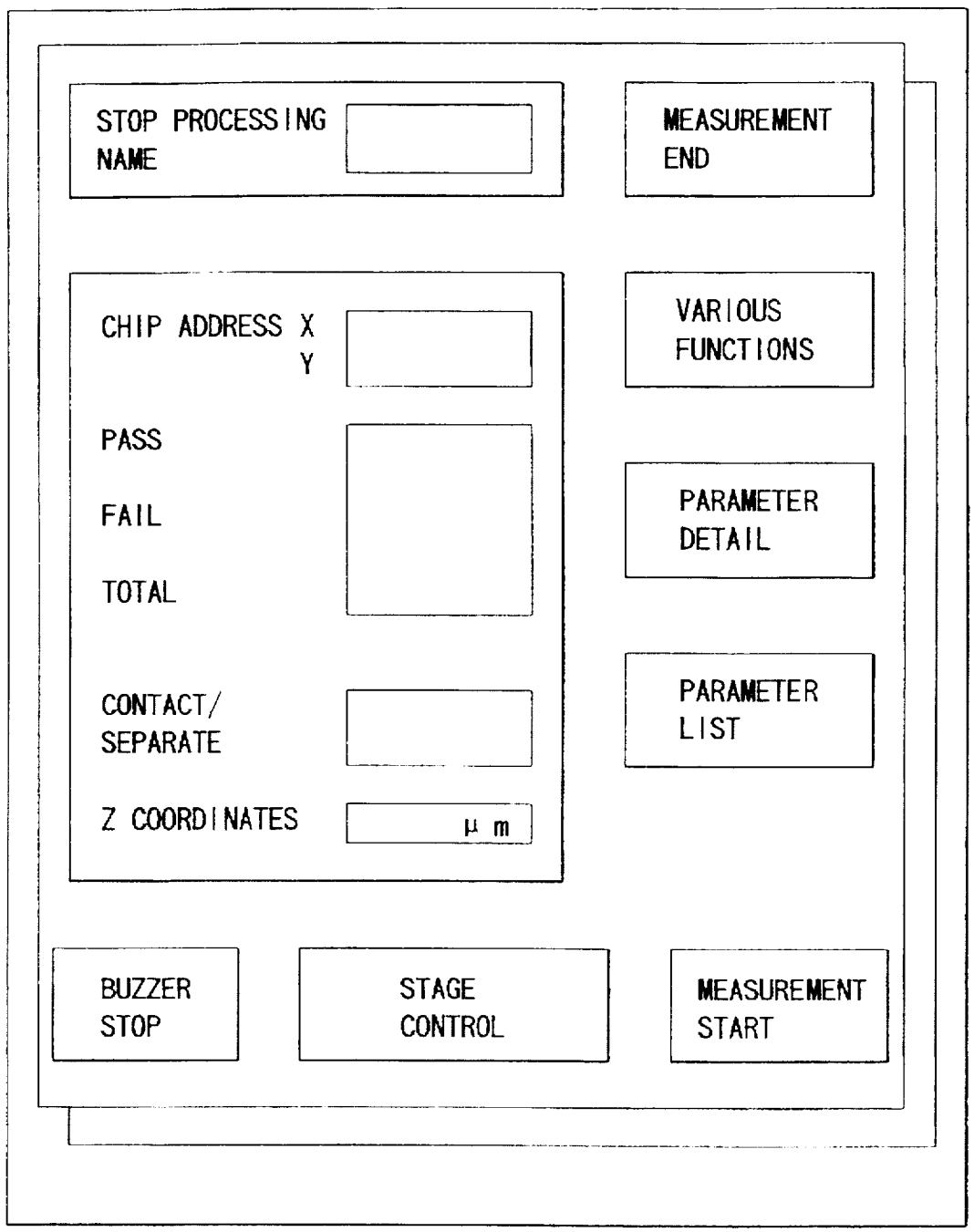
FIG. 16 is a view showing an example of the operation screen on the touchpanel.

In the screen of FIG. 11, pressing "Stop" switch causes the measurement to be temporarily stopped, and a screen shown in FIG. 16 to be displayed, and at this point, further pressing "Parameter detail" switch causes a screen similar to that displayed when the above-mentioned "Parameter confirmation" switch is pressed to be displayed. Instead, pressing "Parameter list" switch causes a screen shown in FIG. 17 to be displayed. The parameter list screen displays collectively items of predetermined parameters, that is, those of parameters considered to be high in using frequency, and typical setting contents of the items. For example, in the item of "Overdrive", with the overdrive amount of the setting contents shown in FIG. 3 taken as typical contents, for example, "−500 μm" is displayed; and in the item of "Postmarking", "Registration" is displayed in order to indicate that marking is performed and the contents relating to the performance are registered.

Other parameters shown in FIG. 17 will be briefly explained. "Start chip stop" is a parameter for specifying motion conditions on which a measured wafer is stopped after the alignment (the operation of aligning the electrode pad array with the probe positional reference point) is finished, but before being measured. Where not stopping is selected, touching "Not stopping" allows another screen to be displayed; and where stopping is selected, a selection can be performed among an initial chip (an initial measuring position), a reference point chip (a position becoming reference of chip coordinates on wafer), and a center chip (a center position of wafer) as a stopping position. This allows a confirmation on whether the probe of the probing card is securely aligned with the electrode pad to be performed before measurement.

Although upon the completion of all measurements of chips on a wafer, usually an unloading (returning of wafer to a specified cassette position) is performed, where the stopping is performed at a position at which the measurement of a final chip is finished, "End chip stop" is a parameter for specifying that stopping motion. Stopping or not stopping can be selected. This function is used where after the measurement is finished, the inspection results are judged to perform the measurement again.

"Unload stop" is a parameter for stopping temporarily a wafer after being measured at a specified position of a loader. Stopping, not stopping, or stopping by an operation from the outside of the prober (an external setting) can be set. This function is used to take out a wafer when whether the needle trace is normal, whether the ink is correctly applied, and the like are visually inspected by the operator.

"Buzzer" is a parameter for setting a determination on whether a warning sound to notify the operation state or abnormality of the apparatus is generated or not. Using or not using can be selected, and for not using, the sound is not generated. "Loader independent operation" is a parameter for permitting a loader to move to a specified position in order to take out a cassette on the loader during measurement. Executing or not executing can be selected, and for executing, a cassette on the loader during measurement can be taken out.

"Measurement screen" is a parameter for selecting a screen indicating the motion state during measurement. "Standard measurement screen" for indicating measuring results in only numerical values, or "Real time wafer map screen" for color coding measuring results by graphic to indicate can be selected. "Continuous fail mode" is a parameter for temporarily stopping the measurement when defectives of measured chips reach the number of arbitrary settings in succession and generating warning. Not using or stopping can be selected, and for stopping, the above-mentioned number of settings can be set.

"Multimeasurement" is a parameter for measuring simultaneously tow chips, four chips, eight chips and the like at one measurement, though usually a prober indexes one chip by one chip to measure. Registering or not registering can be selected, and for registering, two multi, four multi and eight multi can be arbitrarily set (where chips are more than eight multi, they are registered as an option).

In the screen of FIG. 17, pressing a switch corresponding to typical contents causes a screen corresponding to the parameter item among screens indicating the detailed setting contents described above to be displayed. Where such "Stop" switches are operated, and a screen indicating detailed setting contents is displayed, pressing a switch for setting contents, for example, "Overdrive amount" switch shown in FIG. 3 allows the setting contents to be changed. When the setting contents of parameters are changed in this manner, after performing the measurement again, the measurement is performed on the basis of the setting contents of parameters after being changed.

In the screen for indicating collectively parameters shown in FIG. 17, the items of operable parameters and the items of inoperable parameters are displayed differently from each other. For example, operable ones are displayed with blue color, while inoperable ones are displayed with red color. Inoperable ones are those which do not use, execute and register applicable parameters, or which are not stopped with respect to "chip stop", and which are meaningless with respect to operation.

According to such embodiment, the typical contents (for example, displays themselves on whether parameter is used, and whether it is registered are also typical contents) of parameters can be confirmed at a glance, and among them, an item of parameters is selected to display detailed contents, thereby providing a significant convenience. Display of operable parameters is discriminated in color from that of inoperable parameters, whereby it becomes much easier to understand operating circumstances.

With reference to FIGS. 18 through 26A, 26B, a probe apparatus in connection with another embodiment of the present invention will be explained hereinafter.

The probe apparatus 10, for example, as shown in FIGS. 18 and 19, comprises a loader 13 including a cassette mounting part 11 for mounting a cassette C in which semiconductor wafers W are housed and a tweezers 12 for transferring the semiconductor wafer W on the cassette mounting part 11, a prober 14 for inspecting the semiconductor wafer W transferred through the tweezers 12 of the loader 13, a controller 15 (a memory unit and a control unit) for controlling the prober 14 and the loader 13, and a display unit 4 which serves also as a control panel and operates the controller 15. The controller and the display unit, as with the above-mentioned embodiments, are such that they set various items and conditions required for electrical measurement, for example, moving conditions of the mounting pedestal and display the items and conditions thus set.

Disposed on the above-mentioned loader 13 is a subchuck 17 for prealigning the semiconductor wafer W with orientation flat (orifla) of the wafer taken as a reference point. Therefore, the tweezers 12 is adapted to transfer the semiconductor wafer W from the cassette C, prealign the semiconductor wafer W on the subchuck 17, and then transfer the semiconductor wafer W to the prober 14.

Disposed on the prober 14 are a main chuck which is movable in the X, Y, Z and θ directions and sucks under vacuum the semiconductor wafer W to place, that is, the mounting pedestal 3, an alignment mechanism 19 for aligning the semiconductor wafer W placed on the mounting pedestal 3, and the probe card 23 having a plurality of probes 2 for electrically inspecting the chips in the semiconductor wafer W aligned by the alignment mechanism 19. The probe card 23 is mounted and fixed to a substantially central portion of the upper wall of an enclosure. Usually, pivotably disposed on the prober 14 is the test head 21; the probe card 23 is electrically connected through the test head 21 pivoting on the prober 14 to a tester (not shown); and a specified signal from the tester is supplied through the test head 21 and the probes 2 to the electrode pads on IC chips of the semiconductor wafer W on the mounting pedestal 3, whereby the chips are electrically inspected sequentially.

Figure 20:
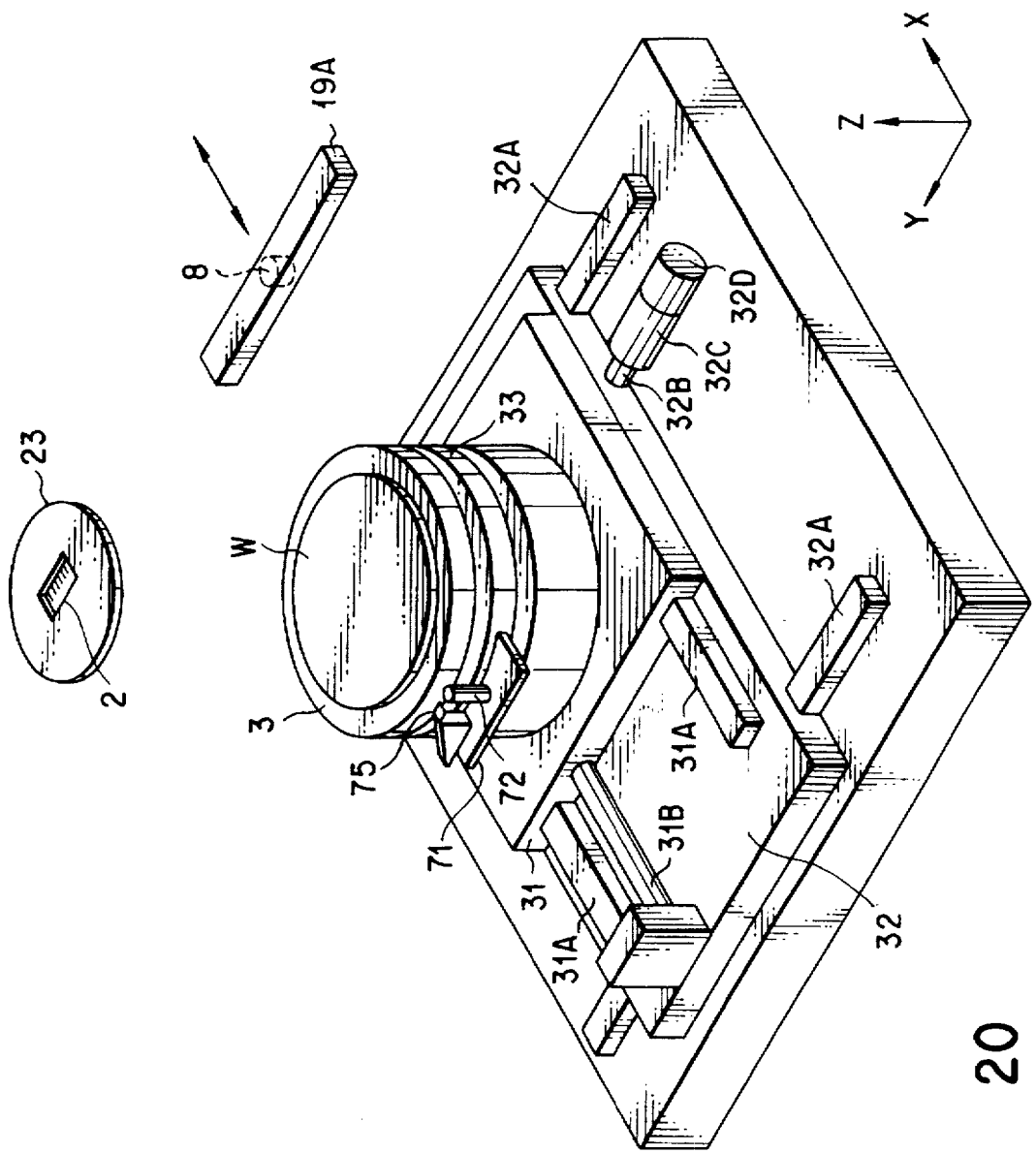
FIG. 20 is a perspective view showing the probe apparatus shown in FIG. 18 in which a main chuck and an alignment mechanism are taken out.
Figure 23A:
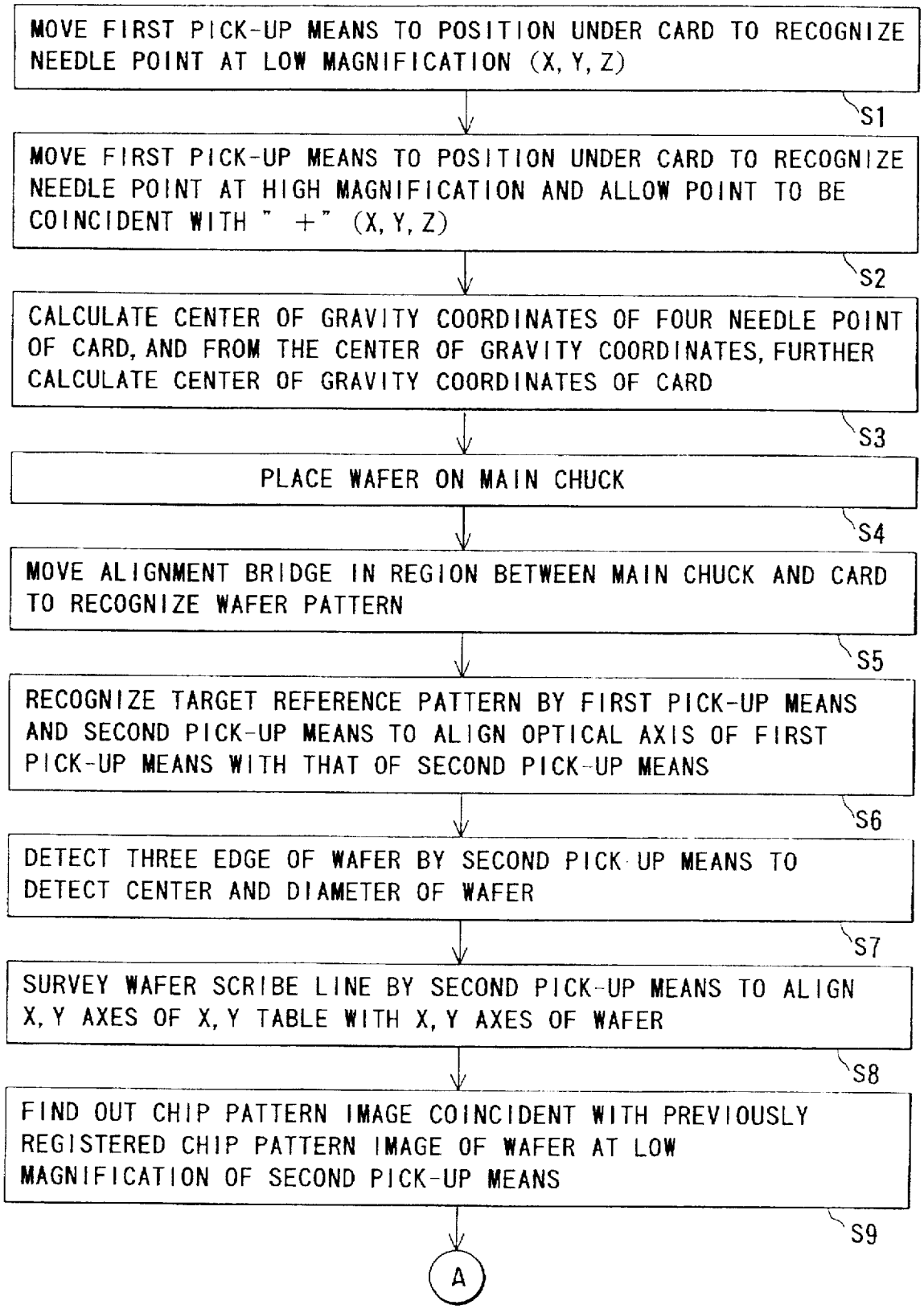
FIGS. 23A and 23B are flowcharts showing one performing motion mode of the probe apparatus shown in FIG. 18.
Figure 23B:
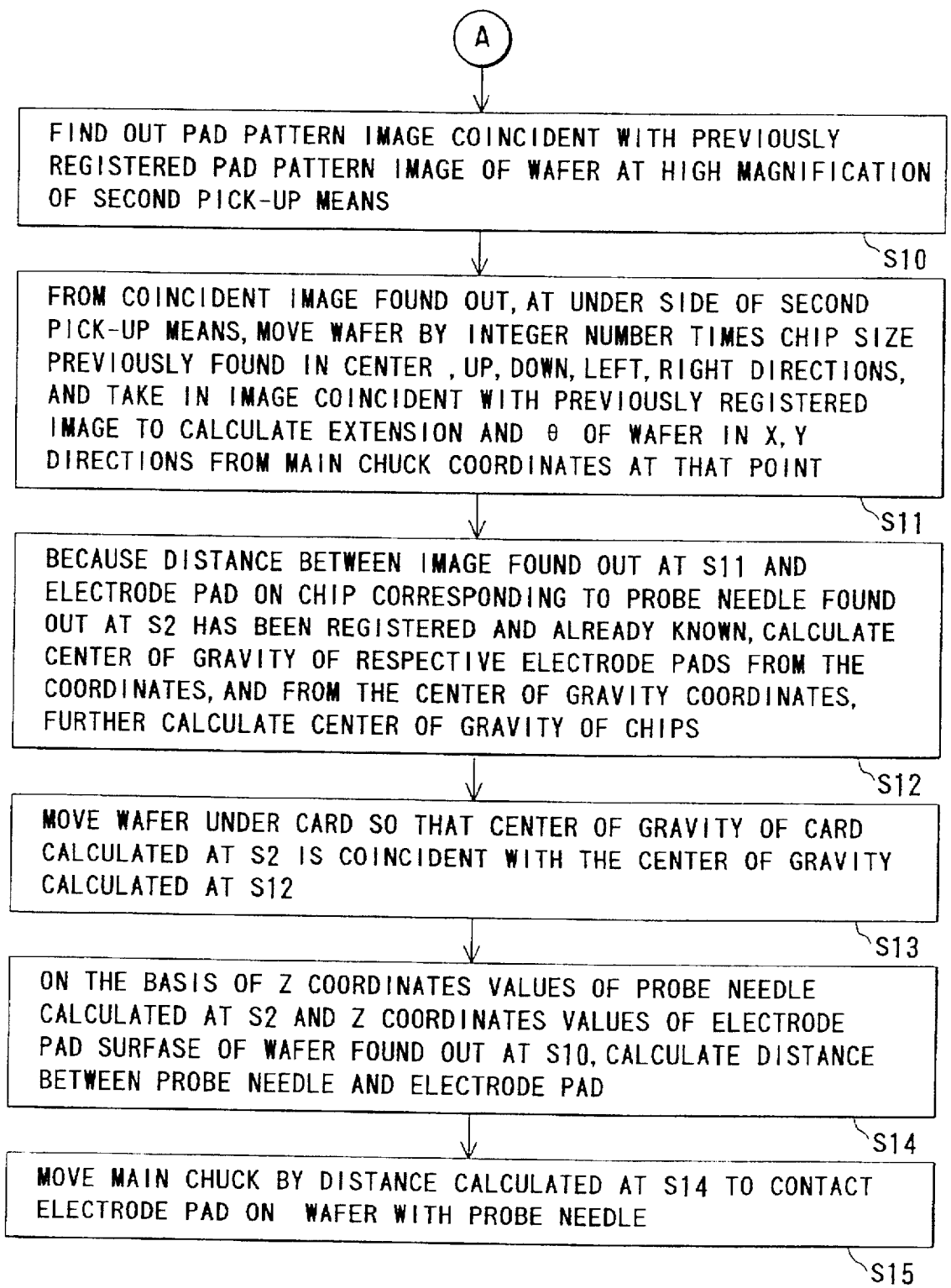

The mounting pedestal 3 is configured such that it is moved on the base by a drive mechanism in the X, Y, Z and θ directions. The drive mechanism, as shown in FIG. 20, is provided with the X table 31 moving in the X direction, the Y table moving in the Y direction, the up/down part 33 moving up/down in the Z direction, and a rotary mechanism (not shown) rotating in the θ direction. The X table 31 is adapted to be guided by a pair of guide rails 31A extending in the X direction and moved through a ball screw 31B and a motor (not shown), the movement being detected by an encoder (not shown). The Y table 32 is adapted to be moved following a pair of guide rails 32A extending in the Y direction and through a ball screw 32B and a motor 32C, the movement being detected by an encoder 32D.

The above-mentioned up/down part 33 is mounted horizontally with a fixing plate 71 as shown in FIG. 20, and disposed on the fixing plate 71 is the first pick-up means 72 consisting of a CCD camera capable of being changed over between a high magnification and a low magnification, so that the array of the entire probes 2 is picked up and the needle point of a specified probe is picked up in magnification by the first pick-up means 72, and the images thus picked up are displayed on a display screen of the display unit 4. Further, disposed on the fixing plate 71 is the target 75 for crossing with the optical axis of the first pick-up means 72 to focus, the target 75 being adapted to be moved forward/backward with respect to the focus position of the first pick-up means 72. The target 75 comprises, for example, a glass plate and a 140 μm-diameter metallic thin film deposited by evaporation thereon, and with the metallic thin film taken as a reference pattern, the image is recognized by the first pick-up means 72, so that the position target 75 is made a focusing plane.

Further, disposed on the prober 14 is an alignment bridge 19A composing the alignment mechanism 19, and the alignment bridge 19A is guided, for example, as shown in FIGS. 18 and 19, by a pair of guide rails 19B extending in the X direction and movable in a region between the mounting pedestal 3 and the probe card 23. Disposed on the alignment bridge 19A is the second pick-up means 8 capable of being changed over between a high magnification and a low magnification; by the second pick-up means 8, the semiconductor wafer W on the mounting pedestal 3 is picked up at a low magnification or a high magnification, and respective images thus picked up are displayed on the display screen of the display unit 4. Also, the focusing plane of the second pick-up means 8 is obtained by image recognizing the metallic thin film of the target 75, as with the first pick-up means 72. The above-mentioned alignment mechanism 19 is an alignment mechanism including the first pick-up means 72, the target 75 and the like as well as the alignment bridge 19A and the second pick-up means 8.

The controller 15 of the probe apparatus 10, for example, as shown in FIG. 21, is provided with the control unit 5 comprising a central processing unit 5B, an image processing part 5C and a motor control part 5A, and with a memory or record part 6; and the controller controls the drive of the drive mechanism of the probe apparatus 10, the previously-described condition setting of the probe and probe card, the image display thereof, and the like. The central processing unit 5B is adapted, for example, to send a control signal to the motor control part 5A so as to control the respective motors of the drive mechanism according to a program registered in the memory 6, to receive a pulse signal from an encoder so as to calculate the movement in the X, Y, Z and θ directions, to calculate the position data and the like of the mounting pedestal 3, and to register the data such as calculated results in the memory 6. The image processing part 5C is adapted to receive a pick-up signal from the first, second pick-up means 72, 8 so as to process an image, to display the processed image on the display screen as a picked-up image, to register the image in the image memory as image data, to compare the picked-up image with the image data previously registered in the image memory, or to judge whether the picked-up image of the first, second pick-up means 72, 8 is focused or not.

With reference to FIGS. 22 through 26A, 26B, one embodiment performing an alignment of the probes 2 with the electrode pads P of a chip of the semiconductor wafer W in the probe apparatus will be explained hereinafter. The aligning method of this embodiment is a method of finally aligning the center of gravity $P_C$ of a pattern of electrode pads $P_1$ through $P_4$ on the chips located on the four corners of the semiconductor wafer W with the center of gravity $N_C$ of a pattern of four probes 2 corresponding to the electrode pads $P_1$ through $P_4$ as shown in FIG. 22, with respect to the semiconductor wafer W received at the mounting pedestal 3 of the prober 14 from the tweezers 12 of the loader 13 as shown in FIG. 19. Such alignment of centers of gravity with each other can be performed according to the flowchart shown in FIGS. 23A and 23B.

Figure 24A:
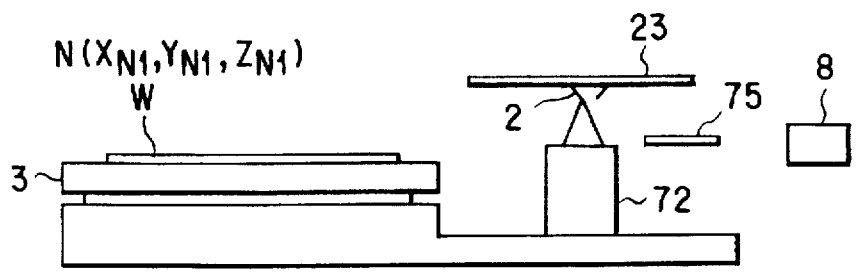
FIGS. 24A through 24C are views showing sequentially the motion position of the main chuck and the like when performing alignment according to the flowchart shown in FIG. 18.
Figure 25A:
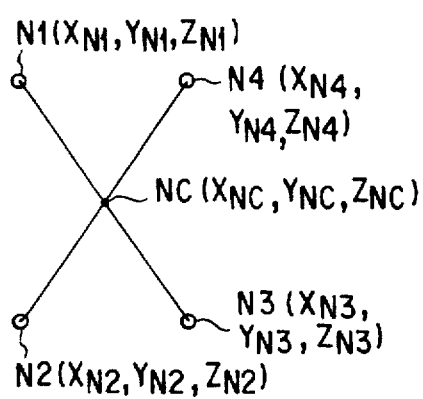
FIG. 25A is a view showing coordinates indicating the center of gravity of four probe needles.
Figure 26A:
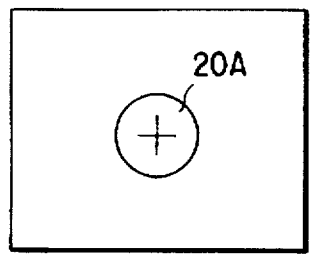
FIG. 26A is a front view showing a display screen on which a pick-up image of a probe needle is displayed.
Figure 26B:
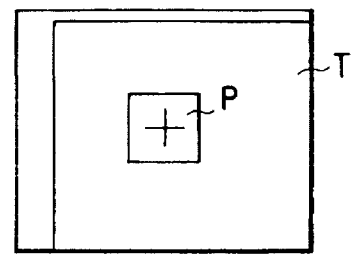
FIG. 26B is a front view showing a display screen on which a pick-up image of an electrode pad of a semiconductor wafer corresponding to the probe needle shown in FIG. 26A.
Figure 27:
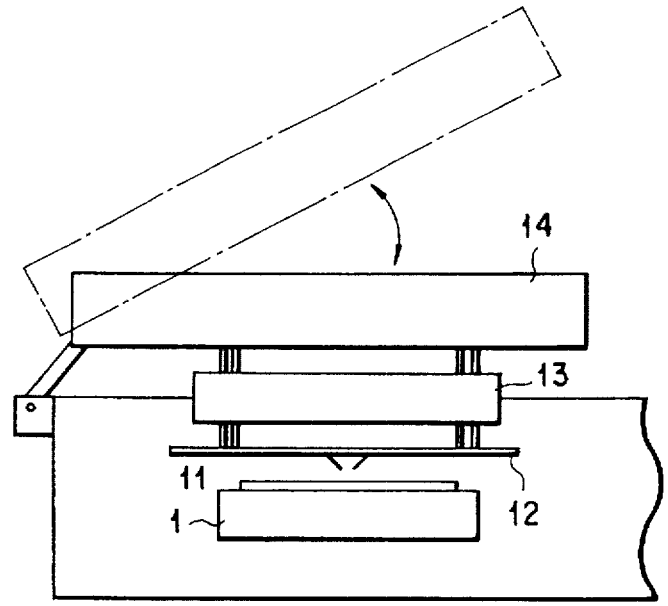
FIG. 27 is a side view showing a schematic of a probe apparatus of prior art.

First, the center of gravity of the probe card is determined. As shown in FIG. 24A, the first pick-up means 72 is moved to the under side of the probe card 23 by the drive mechanism, and the first pick-up means 72 is lowered to a position at which the needle points of all probes 2 become coincident with the focusing plane of the pick-up means to recognize the needle points at a low magnification (S1). Thereafter, the magnification of the pick-up means is changed over to a high magnification to recognize and pick up the needle point of the predetermined probe 2 on the upper left side of FIG. 25A among four corners of the probe card 23, and align the image with "+" mark at the center of the display screen as shown in FIG. 26A (S2). On the basis of the pulse signal of the encoder corresponding to the movement of the mounting pedestal 3 in the X, Y and Z directions at that point, the center of gravity of the needle point of the probe 2 is calculated in the central processing unit 5B to determine it as the center of gravity coordinates $N_1$ ($X_{N1}$, $Y_{N1}$, $Z_{N1}$), the center of gravity coordinates $N_1$ being registered through the central processing unit 5B in the memory 6. Then, the first pick-up means 72 is moved sequentially and counterclockwise to a position just below three other probes 2 to determine sequentially the centers of gravity of respective probes 2 as the centers of gravity coordinates $N_2$ ($X_{N2}$, $Y_{N2}$, $Z_{N2}$), $N_3$ ($X_{N3}$, $Y_{N3}$, $Z_{N3}$), $N_4$ ($X_{N4}$, $Y_{N4}$, $Z_{N4}$) as with the above-described case, these centers of gravity coordinates $N_2$, $N_3$, $N_4$ being registered through the central processing unit 5B in the memory 6. Thereafter, on the basis of these four centers of gravity coordinates, the center of gravity of a pattern of four probes 2, that is, the center of gravity coordinates $N_C$ ($X_{NC}$, $Y_{NC}$, $Z_{NC}$) is determined by the following equations (1) through (3) to register the center of gravity coordinates in the memory 6 (S3). The data on these centers of gravity coordinates are obtained as shown in FIG. 25A.

$$X_{NC}=(X_{N1}+X_{N2}+X_{N3}+X_{N4})/4 \quad (1)$$

$$Y_{NC}=(Y_{N1}+Y_{N2}+Y_{N3}+Y_{N4})/4 \quad (2)$$

$$Z_{NC}=(Z_{N1}+Z_{N2}+Z_{N3}+Z_{N4})/4 \quad (3)$$

Figure 24B:
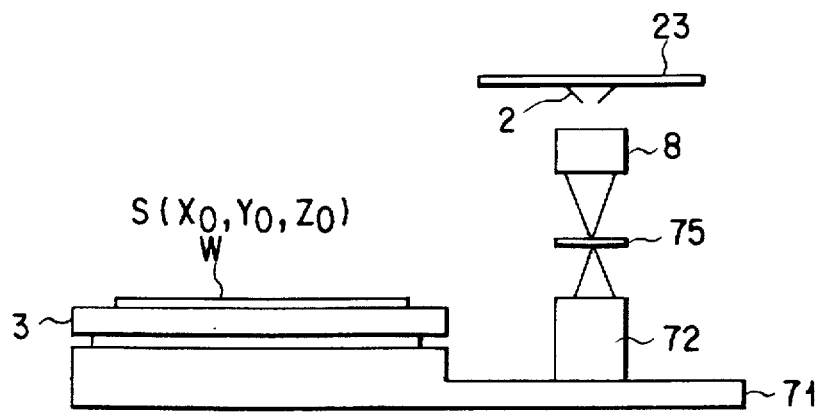

Then, as described in detail below, the optical axes of the first, second pick-up means 72, 8 are allowed to be coincide with each other as shown in FIG. 24B to determine the position thereof. That is, the semiconductor wafer W is placed by the tweezers 12 from the loader 13 onto the mounting pedestal 3 in the prober 14 (S4), and then the alignment bridge 19A is moved to a region between the mounting pedestal 3 and the probe card 23 and stopped at a certain position (a place where wafer pattern is recognized by picking up at a low magnification) in the lower side of the probe card 23 (S5). Then, the target 75 is moved to the upper side of the first pick-up means 72 to align the focus of the first pick-up means 72 with the center of the target 75 so as to recognize the metallic thin film; and at the same time, the second pick-up means 8 is driven in such a manner that the focus thereof is aligned with the center of the target 75 so as to recognize the metallic thin film. When the respective recognitions are aligned with each other, the optical axes of the first, second pick-up means 72, 8 are coincident with each other (S6). A reference coordinates ($X_0$, $Y_0$, $Z_0$) at the intersection of the focusing plane with the optical axis at this point is calculated from the position of the mounting pedestal 3 to register the calculated value in the memory 6. The movement of the first pick-up means 72 at that point is detected through the encoder, whereby the relationship in position between the above-mentioned centers of gravity coordinates and the reference coordinates can be determined on the coordinates.

Thereafter, the center and diameter of the semiconductor wafer W are determined using the second pick-up means 8 in a manner as shown below (S7). That is, the target 75 is moved backward from the focusing plane of the first pick-up means 72, then the mounting pedestal 3 is moved by the drive mechanism, and during movement, for example, three edge points of the semiconductor wafer W are detected by the second pickup means 8; and on the basis of the detected results, the center and diameter of the semiconductor wafer W are calculated in the central processing unit 5B on the basis of the moving distance of the mounting pedestal 3 to register the calculated results in the memory 6. Subsequently, the scribe line of the semiconductor wafer W is surveyed at a low magnification by the second pick-up means 8, and the X, Y axes of the semiconductor wafer W are rotated in the θ direction so as to be aligned with the X, Y axes of the X, Y tables 31, 32 (S8). This causes an IC chip T of the semiconductor wafer W to be aligned in the index feed direction.

Further, the mounting pedestal 3 is moved by the drive mechanism so as to image recognize the semiconductor wafer W on the mounting pedestal 3 by the second pick-up means 8; and in the image processing part 5C, the picked up image is compared with various aligning chip pattern images previously registered to find out a coincident chip pattern image (S9). When the coincident chip pattern image is found out, with the low magnification changed over to a high magnification, as with S9, the magnified chip image (pad pattern image) is compared with a characteristic chip image (pad pattern image) previously registered to find out a coincident chip image, which image is registered in the image processing part 5C as a needle aligning image. When the coincident chip image is found out, the semiconductor wafer W is moved from the image by integer number times the chip size previously found in the center, up, down, left and right directions; during the movement, while the semiconductor wafer W is picked up by the second pick-up means 8, the image is compared with a characteristic chip image (pad pattern image) previously registered in the image processing part 5C to sequentially take in a coincident chip image and register in the image processing part 5C; and from the coordinates value of the mounting pedestal 3 at that point, the moving distance of the IC chips T is calculated in the central processing unit 5B and registered in the memory 6 (S11).

Figure 24C:
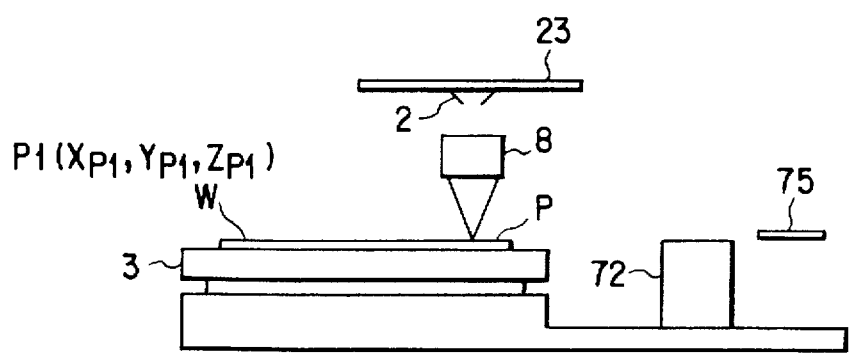
Figure 25B:
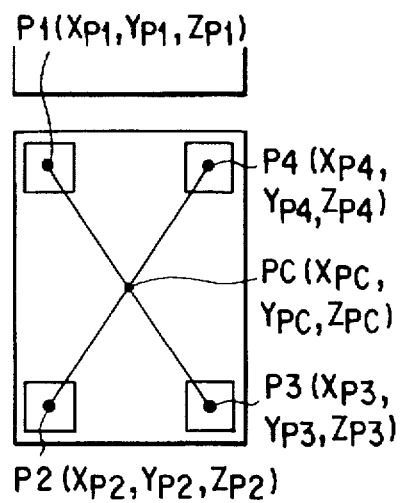
FIG. 25B is a view showing coordinates indicating the center of gravity of electrode pads of a chip wafer corresponding to the four probe needles shown in FIG. 24A.

Then, the center of gravity of the IC chip T formed in the semiconductor wafer W is determined in the manner as described below (S12). That is, as shown in FIG. 24C, from a high-magnification chip pick-up image (see FIG. 26B) found out at S11, the distance of the electrode pad P on the IC chip T corresponding to the probe 2 found out at S2 is previously registered and thus already known, so that as shown in FIG. 25B, on the basis of this distance and the current position coordinates of the mounting pedestal 3, the centers of gravity of electrode pads $P_1$ through $P_4$ at four corners are calculated and determined in the central processing unit 5B as the center of gravity coordinates $P_1$ ($X_{P1}$, $Y_{P1}$, $Z_{P1}$), $P_2$ ($X_{P2}$, $Y_{P2}$, $Z_{P2}$), $P_3$ ($X_{P3}$, $Y_{P3}$, $Z_{P3}$), $P_4$ ($X_{P4}$, $Y_{P4}$, $Z_{P4}$) and registered in the memory 6, and then on the basis of four centers of gravity coordinates, the center of gravity of a pattern of four electrode pads P, that is, the center of gravity coordinates $P_C$ ($X_{PC}$, $Y_{PC}$, $Z_{PC}$) is determined by the following equations (4) through (6) to register the center of gravity coordinates in the memory 6. The data on these centers of gravity coordinates are obtained as shown in FIG. 25B.

$$X_{PC}=(X_{P1}+X_{P2}+X_{P3}+X_{P4})/4 \quad (4)$$

$$Y_{PC}=(Y_{P1}+Y_{P2}+Y_{P3}+Y_{P4})/4 \quad (5)$$

$$Z_{PC}=(Z_{P1}+Z_{P2}+Z_{P3}+Z_{P4})/4 \quad (6)$$

As described above, after the center of gravity of the pattern of the probes 2 (the center of gravity of the probe card 23) and the center of gravity of the pattern of four electrode pads P (the center of gravity of the IC chip T) are determined (S12), the semiconductor wafer W is moved in such a manner that respective coordinates values ($X_{NC}$, $Y_{NC}$) of the centers of gravity of four probes 2 in the X, Y directions become coincident with respective coordinates values ($X_{PC}$, $Y_{PC}$) of the centers of gravity of four electrode pads P in the X, Y directions (S13). That is, on the basis of the center of gravity coordinates $N_C$ ($X_{NC}$, $Y_{NC}$, $Z_{NC}$) of the probe card 23 and the center of gravity coordinates $P_C$ ($X_{PC}$, $Y_{PC}$, $Z_{PC}$) of the IC chip T, a horizontal distance between both is calculated by the central processing unit 5B; a control signal on the basis of the calculated value is supplied from the central processing unit 5B to the motor control part 5A to drive and control, through the motor control part 5A, the drive mechanism, thereby moving the mounting pedestal 3 in the horizontal direction; and at a position at which the center of gravity of the IC chip T becomes coincident with the center of gravity of the probe card 23, the drive mechanism is stopped.

Further, from the coordinates value $Z_{NC}$ of the probe card 23 in the Z direction and coordinates value $Z_{PC}$ of the IC chip T in the Z direction, a height at which four probes 2 contact with four electrode pads P is calculated in the central processing unit 5B (S14); and a control signal on the basis of the calculated value is supplied from the central processing unit 5B to the motor control part 5A to drive and control, through the motor control part 5A, the drive mechanism, thereby moving the mounting pedestal 3 and contacting the electrode pads P of the IC chip T with the respective probes 2 (S15). At this point, an overdrive is applied by a short distance to the mounting pedestal 3 to contact electrically the electrode pads P with the probes 2.

According to this embodiment as described above, there are a process of determining respective centers of gravity of the electrode pads P at four corners of the IC chips T as centers of gravity coordinates $P_1$, $P_2$, $P_3$, $P_4$, a process of determining the center of gravity of a pattern of four electrode pads P as the center of gravity coordinates PC on the basis of these centers of gravity coordinates $P_1$, $P_2$, $P_3$, $P_4$, a process of determining the centers of gravity of the needle points of respective probes 2 corresponding to respective electrode pads P as centers of gravity coordinates $N_1$, $N_2$, $N_3$, $N_4$, a process of determining the center of gravity of a pattern of four probes 2 as the center of gravity coordinates $N_C$ of the probe card 23 on the basis of these centers of gravity coordinates $N_1$, $N_2$, $N_3$, $N_4$ of these probes 2, and a process of aligning the center of gravity coordinates $P_C$ of the IC chips T with the center of gravity coordinates $N_C$ of the probe card 23 both of which are determined in these processes, so that in aligning a plurality of probes 2 with electrode pads P corresponding thereto, even when the needle point of any probe 2 is somewhat dislocated from the original position, or even when the position of the electrode pads P is somewhat dislocated from the original position, the probe or probes 2 can be gathered near the centers of gravity of the electrode pads P corresponding thereto, whereby all probes 2 can be simply and securely contacted with the electrode pads P corresponding thereto without requiring a skill.

According to this embodiment, other than the above-mentioned processes, there is a process of picking up the needle points of four probes 2 by the first pick-up means 72, and a process of picking up four electrode pads P corresponding to respective probes 2 by the second pick-up means 8, so that aligning the picked up image with the center of display screen allows the center of gravity of the probe card 23 and that of the IC chips T to be determined.

Also, according to this embodiment, other than the above-mentioned processes, there is a process of allowing the optical axis of the first pick-up means 72 to be coincident with that of the second pick-up means 8, so that a highly accurate positioning can be performed without being affected by the thermal effect of the ball screw of the drive mechanism on the mounting pedestal 3 and the like.

Although in the embodiment, the center of gravity of the probe card 23 is determined, then the point at which the first and second pick-up means 72, 8 are coincident in optical axis with each other is determined, and then the center of gravity of the IC chip T is determined, the sequence of steps may be changed each other. Although in the above-mentioned embodiment, a probing method for a case where the semiconductor wafer W is inspected has been explained, the probing method of the present invention can be also applied to a probing method for a case where a liquid crystal displaying board is inspected.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A probing method, comprising:
    providing a subject having a part that is to be inspected and arrayed with electrode pads in a specified pattern on a mounting pedestal, and moving the mounting pedestal in the X, Y, θ directions relatively to a probe card having probes so that said electrode pads are opposite to the probe card provided in a specified pattern to effect an alignment;
    moving said mounting pedestal in the Z direction with respect to the probe card, and contacting the electrode pads with the probes; and electrically measuring the part to be inspected under the contact of the electrode pads with the probes;

wherein said moving process includes moving the mounting pedestal in the Z direction to apply an overdrive to contact the electrode pads with the probes to provide a first overdrive state, and moving the mounting pedestal from the first overdrive state to a second overdrive state in which the electrode pads contact with the probes in an overdrive amount less than that in the first overdrive state; and said electrically measuring process is performed only in the second overdrive state.

2. A probing method as set forth in claim 1, wherein said electrically measuring process step is performed a first time in the first overdrive state followed by a second time in the second overdrive state.

3. A probing method as set forth in claim 1, wherein said electrically measuring process step is performed a first time in the second overdrive state followed by a second time in the first overdrive state.

4. A probing method as set forth in claim 1, wherein said electrically measuring process step is performed a first and second time in one of the first and second overdrive states.

5. A probing method as set forth in claim 1, further comprising: scratching a surface of the electrode pads in the first overdrive state; and said electrically measuring process step is performed in the second overdrive state.

6. A probing method, comprising:

providing a subject having a part that is to be inspected and arrayed with electrode pads in a specified pattern on a mounting pedestal and moving the mounting pedestal in the X, Y, θ directions relatively to a probe card having probes so that said electrode pads are opposite to the probe card provided in a specified pattern to effect an alignment;

moving said mounting pedestal in the Z direction with respect to the probe card, and contacting the electrode pads with the probes; and electrically measuring the part to be inspected under the contact of the electrode pads with the probes;

wherein said alignment process includes steps of determining the centers of gravity of a plurality of electrode pads, determining the center of gravity of pattern of electrode pads on the basis of the centers of gravity of these electrode pads, determining the centers of gravity of a plurality of probe points, determining the center of a pattern of gravity of pattern of probe points on the basis of the centers of gravity of the plurality of probe points, and aligning the center of gravity of the pattern of said electrode pads with the center of gravity of the pattern of said probes.

7. A probing method, comprising:

providing a subject having a part that is to be inspected and arrayed with electrode pads in a specified pattern on a mounting pedestal, and moving the mounting pedestal in the X, Y, θ directions relatively to a probe card having probes so that said electrode pads are opposite to the probe card provided in a specified pattern to effect an alignment;

moving said mounting pedestal in the Z direction with respect to the probe card, and contacting the electrode pads with the probes; and electrically measuring the part to be inspected under the contact of the electrode pads with the probes;

wherein said alignment process includes steps of picking up a plurality of probe points by a first pick-up means to determine the centers of gravity of respective probes, picking up a plurality of electrode pads by a second pick-up means to determine the centers of gravity of respective probes, picking up a plurality of electrode pads by a second pick-up means to determine the centers of gravity of respective electrode pads, determining the center of gravity of a pattern of probe points on the basis of the image obtained by said first pick-up means, determining the center of gravity of a pattern of electrode pads on the basis of the image obtained by said second pick-up means, aligning the center of gravity of the pattern of said electrode pads with that of the pattern of said probe points, and moving the mounting pedestal in the θ direction with the center of gravity of patterns of said probe points taken as a center so as to align the center of gravity of electrode pads with that of probe points.

8. A probing method, comprising:

providing a subject having a part that is to be inspected and arrayed with electrode pads in a specified pattern on a mounting pedestal, and moving the mounting pedestal in the X, Y, θ directions relatively to a probe card having probes so that said electrode pads are opposite to the probe card provided in a specified pattern to effect an alignment;

moving said mounting pedestal in the Z direction with respect to the probe card, and contacting the electrode pads with the probes; and electrically measuring the part to be inspected under the contact of the electrode pads with the probes;

wherein said alignment process includes steps of picking up a plurality of probe points by a first pick-up means, picking up a plurality of electrode pads by a second pick-up means, allowing the optical axis of the first pick-up means to be coincident with that of the second pick-up means, determining the centers of gravity of probe points on the basis of the image obtained by said first pick-up means, determining the center of gravity of a pattern of probes on the basis of the centers of gravity of said probe points, determining the centers of gravity of electrode pads on the basis of the image obtained by said second pickup means, determining the center of gravity of a pattern of electrode pads on the basis of the centers of gravity of said electrode pads, aligning the center of gravity of the pattern of said probe points with that of the pattern of said electrode pads, and moving the mounting pedestal in the θ direction with the center of gravity of patterns of said probe points taken as a center so as to align the center of gravity of electrode pads with that of probe points.

* * * * *